United States Patent
Kuang et al.

(10) Patent No.: US 11,569,348 B2
(45) Date of Patent: Jan. 31, 2023

(54) SEMICONDUCTOR DEVICES AND METHODS OF FABRICATION THEREOF

(71) Applicant: TAIWAN SEMICONDUCTOR MANUFACTURING COMPANY, LTD., Hsinchu (TW)

(72) Inventors: Shin-Jiun Kuang, Hsinchu (TW); Meng-Yu Lin, Hsinchu (TW); Chun-Fu Cheng, Zhubei (TW); Chung-Wei Wu, Ju-Bei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/187,320

(22) Filed: Feb. 26, 2021

(65) Prior Publication Data

US 2022/0278196 A1 Sep. 1, 2022

(51) Int. Cl.
| | |
|---|---|
| *H01L 29/06* | (2006.01) |
| *H01L 29/66* | (2006.01) |
| *H01L 29/78* | (2006.01) |
| *H01L 21/8234* | (2006.01) |

(52) U.S. Cl.
CPC .. *H01L 29/0673* (2013.01); *H01L 21/823431* (2013.01); *H01L 29/0653* (2013.01); *H01L 29/6656* (2013.01); *H01L 29/66553* (2013.01); *H01L 29/66795* (2013.01); *H01L 29/7848* (2013.01); *H01L 29/7851* (2013.01)

(58) Field of Classification Search
CPC ......... H01L 21/02603; H01L 21/28141; H01L 21/823431; H01L 21/823821; H01L 21/845; H01L 27/0886; H01L 27/0924; H01L 27/10879; H01L 27/1211; H01L 29/0653; H01L 29/0665; H01L 29/0669; H01L 29/0673; H01L 29/41791; H01L 29/66439; H01L 29/6653; H01L 29/66553; H01L 29/6656; H01L 29/66636; H01L 29/66795; H01L 29/775; H01L 29/7848; H01L 29/785; H01L 29/7851; H01L 29/7853; H01L 29/7855; H01L 2029/7858

See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2019/0027570 A1* | 1/2019 | Ching ................. H01L 29/0673 |
| 2019/0096996 A1* | 3/2019 | Song ................. H01L 29/66545 |
| 2020/0105872 A1* | 4/2020 | Glass ................. H01L 29/78618 |
| 2020/0395446 A1* | 12/2020 | Yi ........................ H01L 29/0673 |
| 2021/0202478 A1* | 7/2021 | Guha ................. H01L 29/66545 |

* cited by examiner

*Primary Examiner* — David C Spalla
(74) *Attorney, Agent, or Firm* — NZ Carr Law Office

(57) ABSTRACT

Embodiments of the present disclosure relate to forming a nanosheet multi-channel device with an additional spacing layer and a hard mask layer. The additional spacing layer provides a space for an inner spacer above the topmost channel. The hard mask layer functions as an etch stop during metal gate etch back, providing improve gate height control.

20 Claims, 48 Drawing Sheets

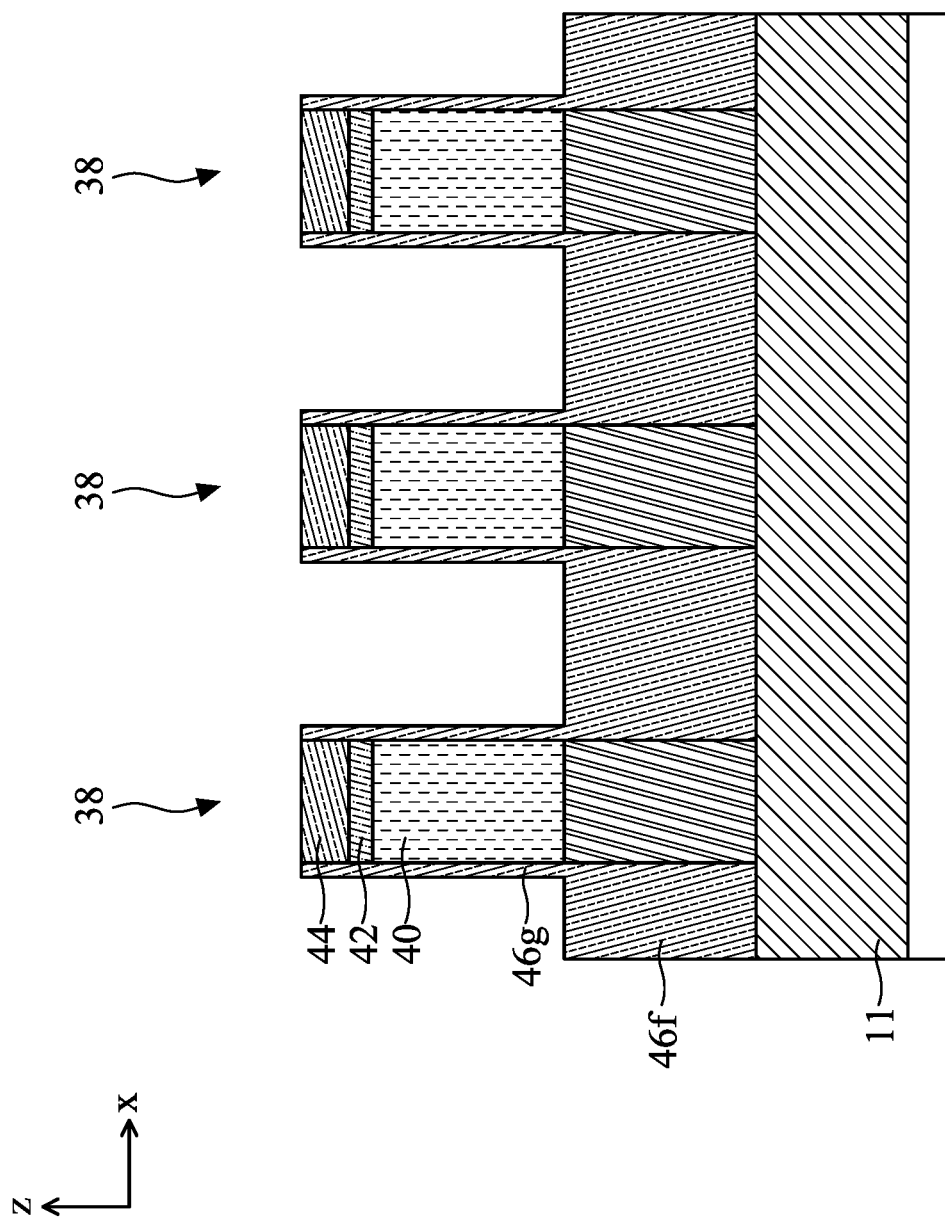

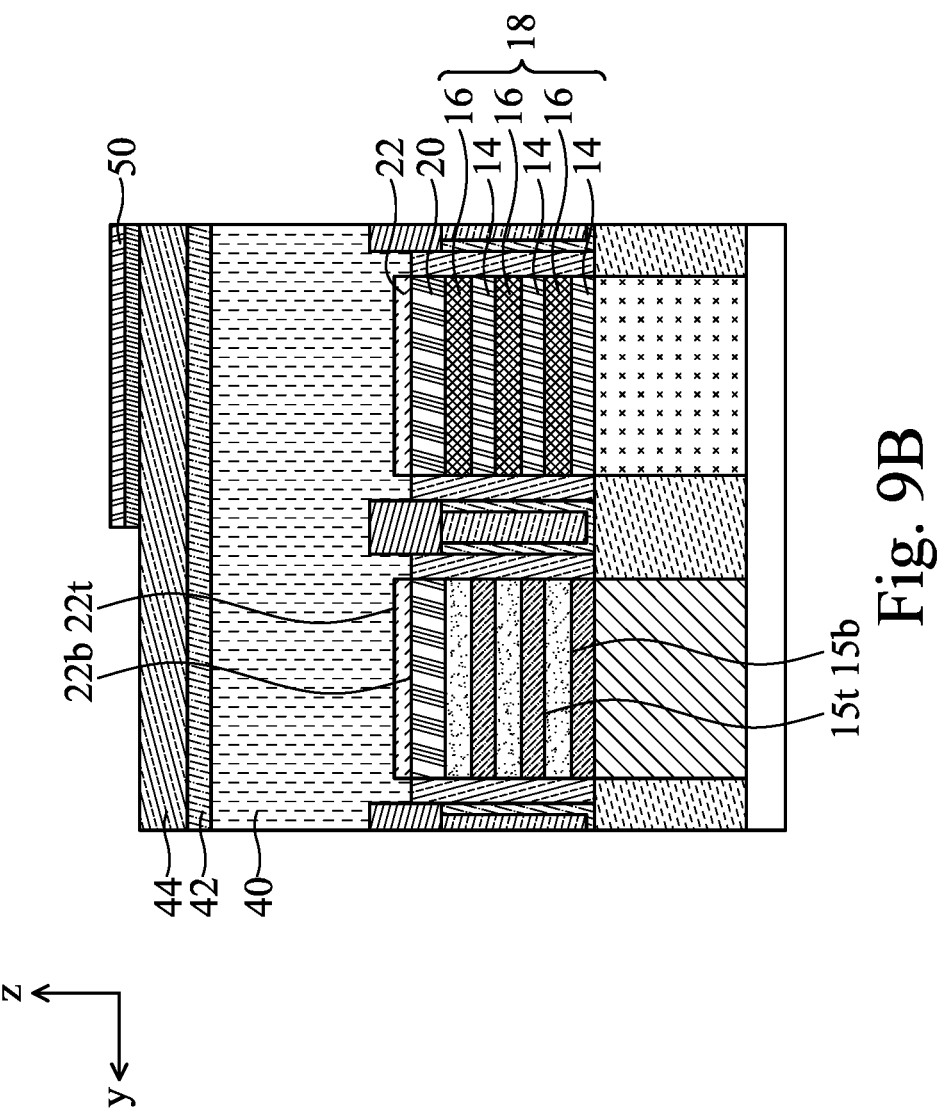

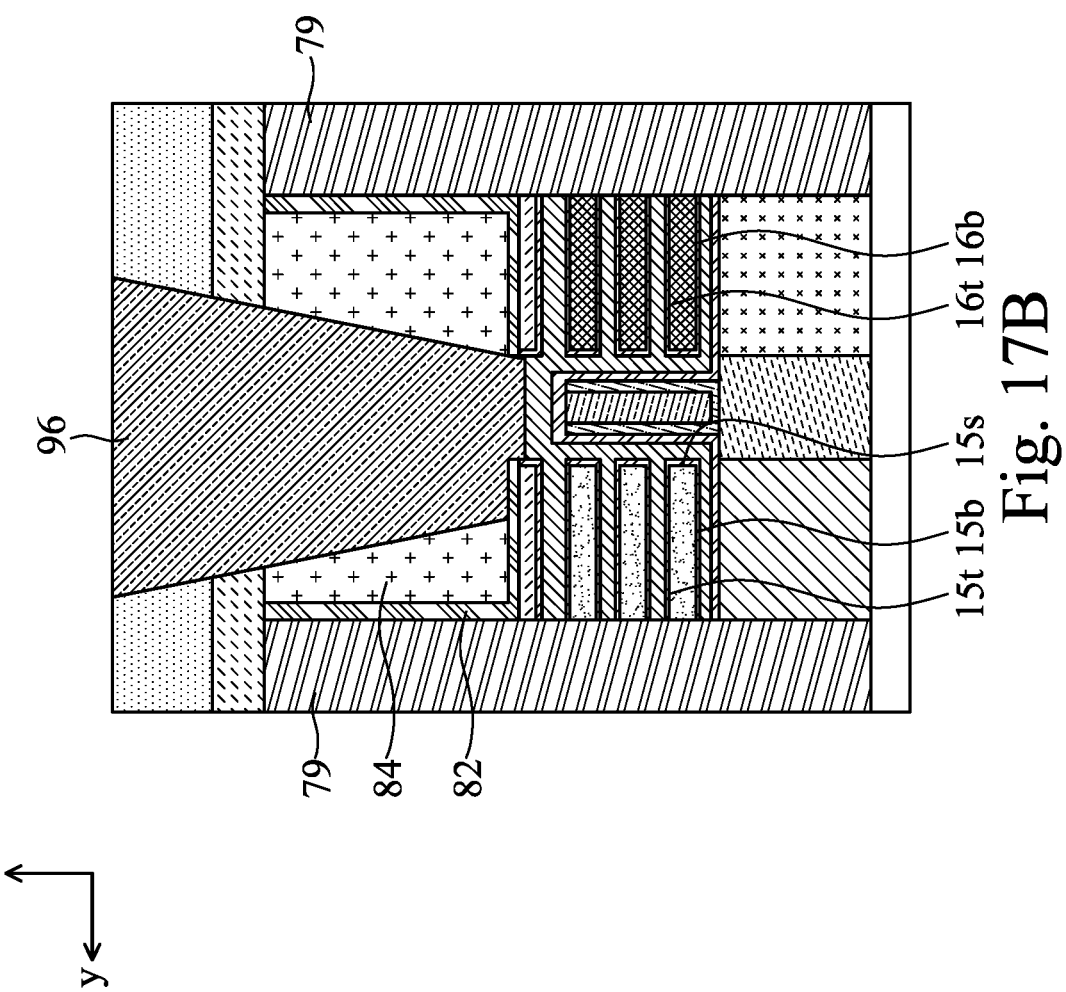

SEMICONDUCTOR DEVICES AND METHODS OF FABRICATION THEREOF

BACKGROUND

The semiconductor industry has experienced continuous rapid growth due to constant improvements in the integration density of various electronic components. For the most part, this improvement in integration density has come from repeated reductions in minimum feature size, allowing more components to be integrated into a given chip area. As minimum feature size reduces, it has become challenging to control metal gate heights and to reduce device capacitance. Therefore, there is a need to solve the above problems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2 to 6, FIGS. 7A-E, FIGS. 8A-E, FIGS. 9A-D, FIGS. 10A-C, FIGS. 11A-D, FIGS. 12A-C, FIGS. 13A-C, FIGS. 14A-D to FIGS. 15A-15D, and FIGS. 16A-C to FIGS. 17A-C schematically illustrate various stages of manufacturing a semiconductor device according to embodiments of the present disclosure.

DETAILED DESCRIPTION

Figure 1:
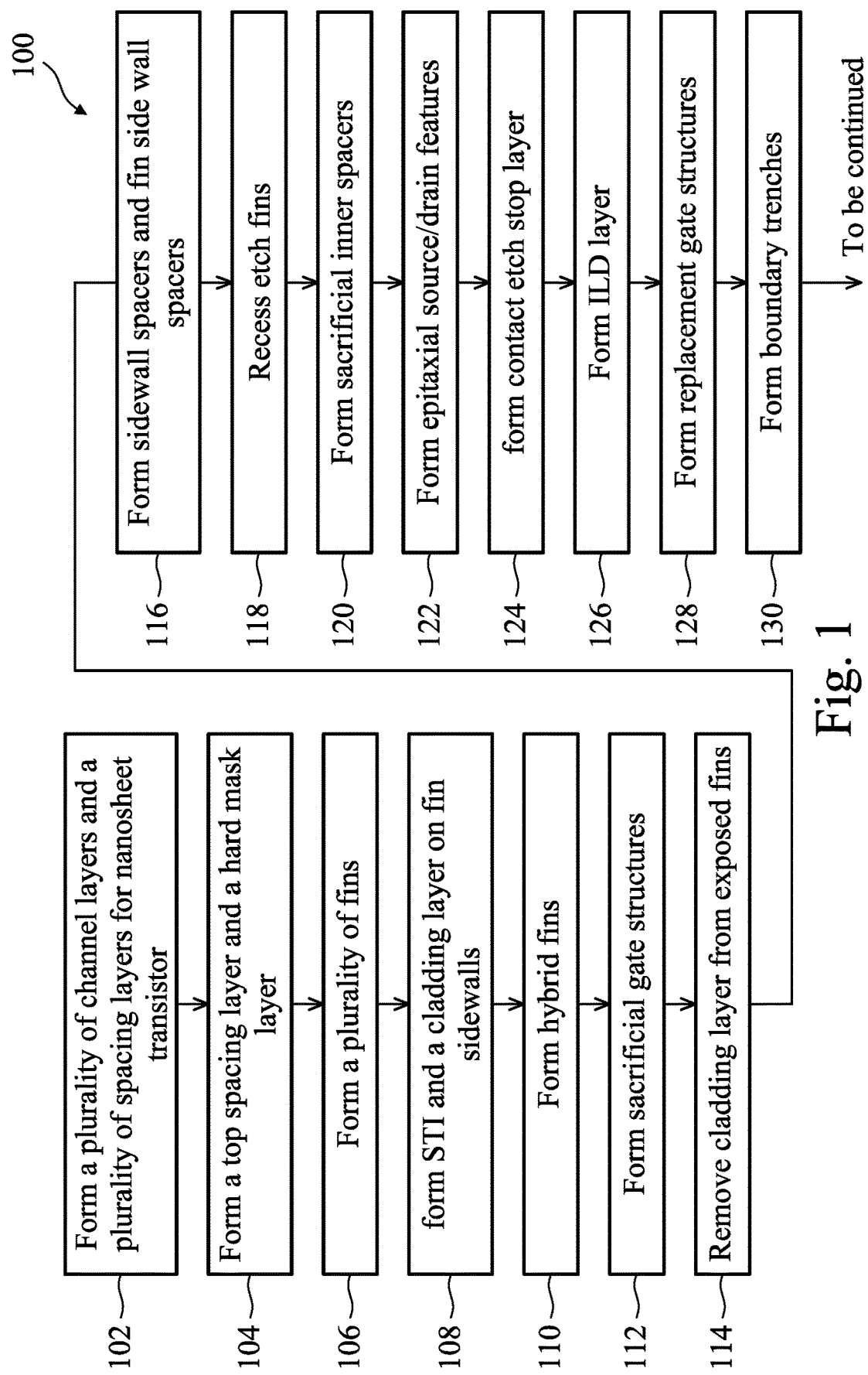
FIG. 1 is a flow chart of a method for manufacturing of a semiconductor device according to embodiments of the present disclosure.
Figure 1:
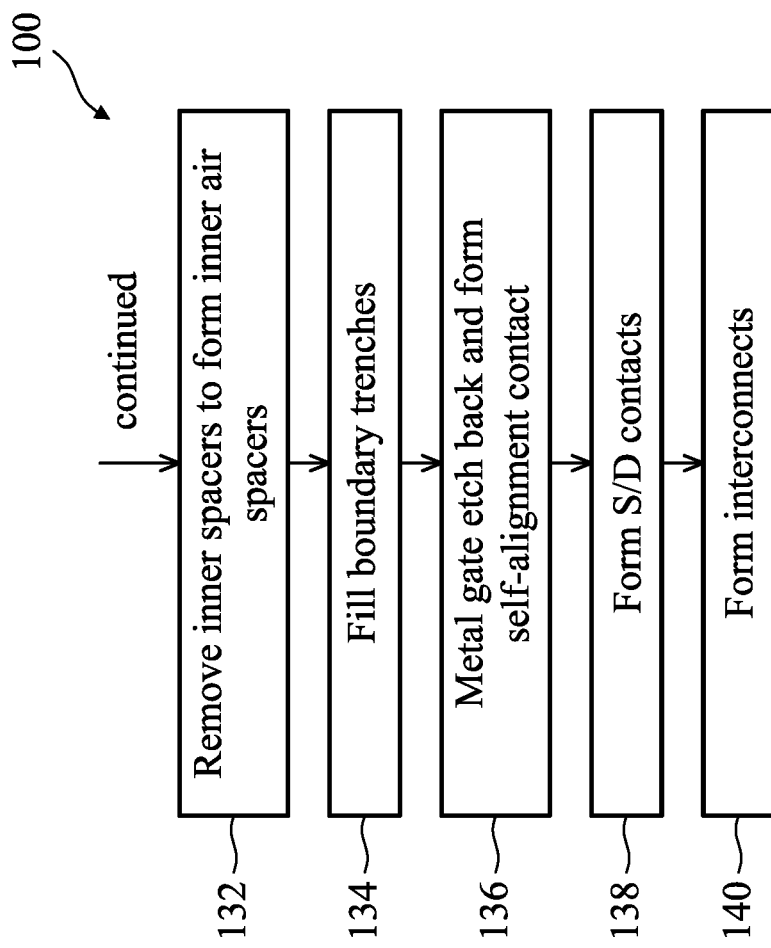

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 64 degrees or at other orientations) and the spatially relative descriptors used herein may likewise be interpreted accordingly.

The foregoing broadly outlines some aspects of embodiments described in this disclosure. While some embodiments described herein are described in the context of nanosheet channel FETs, implementations of some aspects of the present disclosure may be used in other processes and/or in other devices, such as planar FETs, Fin-FETs, Horizontal Gate All Around (HGAA) FETs, Vertical Gate All Around (VGAA) FETs, and other suitable devices. A person having ordinary skill in the art will readily understand other modifications that may be made are contemplated within the scope of this disclosure. In addition, although method embodiments may be described in a particular order, various other method embodiments may be performed in any logical order and may include fewer or more steps than what is described herein. In the present disclosure, a source/drain refers to a source and/or a drain. A source and a drain are interchangeably used.

FIG. 1 is a flow chart of a method 100 for manufacturing of a semiconductor device according to embodiments of the present disclosure. FIGS. 2 to 6, FIGS. 7A-D, FIGS. 8A-C, FIGS. 9A-D, FIGS. 10A-C to FIGS. 13A-C, FIGS. 14A-D to FIGS. 15A-15D, and FIGS. 16A-C to FIGS. 17A-C schematically illustrate various stages of manufacturing a semiconductor device according to embodiments of the present disclosure. Additional operations can be provided before, during, and after operations/processes in the method 100, and some of the operations described below can be replaced or eliminated, for additional embodiments of the method. The order of the operations/processes may be interchangeable.

Figure 2:
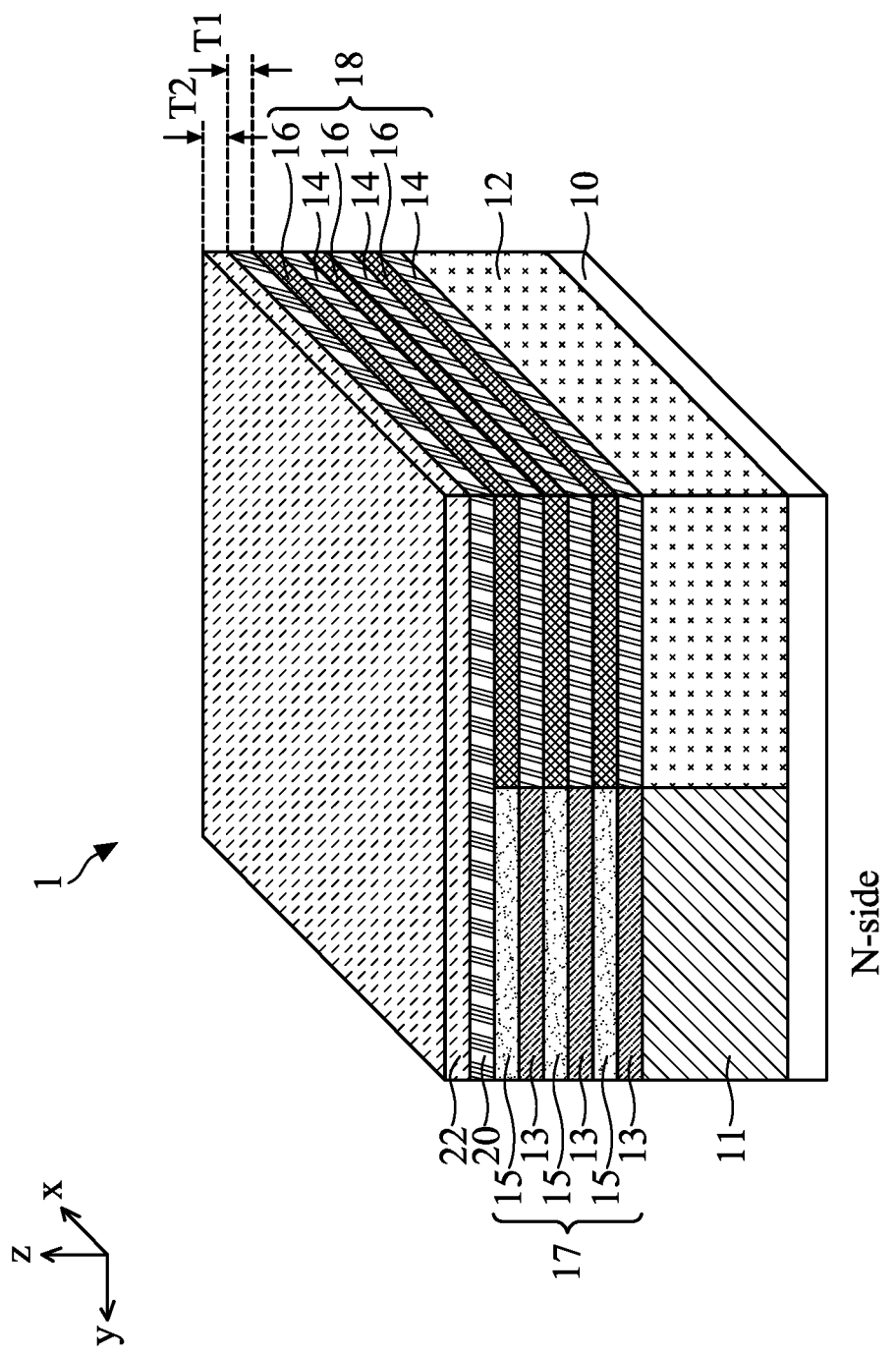

The method 100 begins at operation 102. At operation 102, two or more channel layers 15, 16 and two or more spacing layers 13, 14 are formed over a substrate 10 where a semiconductor device 1 is to be formed. FIG. 2 is a schematic perspective view of the semiconductor device 1 during operation 102.

In FIG. 2, the substrate 10 is provided to form a semiconductor device thereon. The substrate 10 may include a single crystalline semiconductor material such as, but not limited to, Si, Ge, SiGe, GaAs, InSb, GaP, GaSb, InAlAs, InGaAs, GaSbP, GaAsSb, and InP. The substrate 10 may include various doping configurations depending on circuit design. For example, different doping profiles, e.g., n-wells, p-wells, may be formed in the substrate 10 in regions designed for different device types, such as n-type field effect transistors (nFET), and p-type field effect transistors (pFET). In some embodiments, the substrate 10 may be a silicon-on-insulator (SOI) substrate including an insulator structure (not shown) for enhancement.

In the embodiment shown in FIG. 2, the substrate 10 includes a p-doped region or p-well 11 and an n-doped region or n-well 12. One or more n-type devices, such as nFETs, are to be formed over and/or within p-well 11. One or more p-type devices, such as pFETs, are to be formed over and/or within n-well 12. FIG. 2 shows that the n-well 12 and the p-well 11 are formed adjacent to one another, which is not limiting. In other embodiments, the p-well 11 and the n-well 12 may be separated by one or more insulation bodies, e.g., shallow trench insulation ("STI"). The p-well 11 and n-well 12 in FIG. 2 are formed using a dual-tub process, in which both p-well 11 and n-well 12 are formed in the substrate 10. Other processes, like a p-well process in an n-type substrate or an n-well process in a p-type substrate are also possible and included in the disclosure. In other words, one of the p-well 11 and n-well 12 is in a doped local region and the other is in the doped substrate. It is also possible that both p-well 11 and n-well 12 are intrinsic or intrinsically doped, e.g., unintentionally doped.

A nanosheet stack 17 is formed over the p-well 11. The nanosheet stack 17 includes layers made of different materials to facilitate formation of nanosheet channels in a multi-gate n-type device, such as nanosheet channel nFETs. In some embodiments, the nanosheet stack 17 includes first spacing layers 13 interposed by first channel layers 15. The first spacing layers 13 and first channel layers 15 have different compositions.

In some embodiments, the first spacing layers 13 and first channel layers 15 are two semiconductor layers having different oxidation rates and/or different etch selectivity. For example, the first channel layers 15 may include silicon (Si). In some embodiments, the first channel layers 15 may include n-type dopants, such as phosphorus (P), arsenic (As), etc. In some embodiments, the first spacing layers 13 may include silicon germanium (SiGe). The first spacing layers 13 may be a SiGe layer including more than 25% Ge in molar ratio. For example, the first spacing layer 13 may be a SiGe layer including Ge in a molar ratio in a range between 25% and 50%.

In other embodiments, the first channel layers 15 may be formed from other materials suitable for channel regions for n-FETs, such as two-dimensional materials, such as graphene, transition metal dichalcogenides (TMDs in the form of MetalX$_2$), such as W$_{52}$, WFe$_2$, MoS$_2$, MoSe$_2$, WSe$_2$, MoTe$_2$, WTe$_2$, or a combination thereof. In later fabrication stages, portions of the first channel layers 15 form nanosheet channels in a multi-gate device. When the first channel layers 15 include two dimensional materials, the first spacing layers 13 may include a metal, such as Cu, Ni, or a metal oxide, such as Al$_2$O$_3$, HfO$_2$ etc. In some embodiments, the first spacing layers 13 may include a semiconductor material, such as SiGe or Si.

The first spacing layer 13 is first deposited on the p-well 11. The first channel layers 15 and the first spacing layers 13 are formed alternatively over each other, with the first channel layer 15 ends on top of the nanosheet stack 17. Three first spacing layers 13 and three first channel layers 15 are alternately arranged as illustrated in FIG. 2 as an example. More or less first spacing layers 13 and first channel layers 15 may be included in the nanosheet stack 17 depending on the desired number of channels in the semiconductor device to be formed. In some embodiments, the number of first spacing layers 13 and first channel layers 15 is between 1 and 10.

A nanosheet stack 18 is formed over the n-well 12. The nanosheet stack 18 includes alternating layers made of different materials to facilitate formation of nanosheet channels in a multi-gate n-type device, such as nanosheet channel pFETs. In some embodiments, the nanosheet stack 18 includes second spacing layers 14 interposed by second channel layers 16. The second spacing layers 14 and second channel layers 16 have different compositions.

In some embodiments, the second spacing layer 14 and second channel layer 16 are two semiconductor layers with different oxidation rates and/or different etch selectivity. In later fabrication stages, portions of the second channel layers 16 form nanosheets of channels in a multi-gate device. In some embodiments, the second spacing layer 14 may include silicon germanium (SiGe). The second spacing layer 14 may be a SiGe layer including more than 25% Ge in molar ratio. For example, the second spacing layer 14 may be a SiGe layer including Ge in a molar ratio in a range between 25% and 50%. In some embodiments, the second spacing layer 14 and the first spacing layer 13 have substantially the same composition. The second channel layer 16 may include silicon, Ge, a compound semiconductor such as SiC, GeAs, GaP, InP, InAs, and/or InSb, an alloy semiconductor such as SiGe, GaAsP, AlInAs, AlGaAs, InGaAs, GaInP, and/or GaInAsP, or combinations thereof. In some embodiments, the second channel layer 16 may be a Ge layer. The second channel layer 16 may include p-type dopants, such as boron.

In other embodiments, the second channel layers 16 in the second nanosheet stack 18 may be formed from other materials suitable for channel regions for p-FETs, such as two-dimensional materials, such as graphene, transition metal dichalcogenides (TMDs in the form of MetalX$_2$), such as WS$_2$, WFe$_2$, MoS$_2$, MoSe$_2$, WSe$_2$, MoTe$_2$, WTe$_2$, or a combination thereof. When the second channel layers 16 include two dimensional materials, the second spacing layers 14 may include a metal, such as Cu, Ni, or a metal oxide, such as Al$_2$O$_3$, HfO$_2$ etc. In some embodiments, the second spacing layers 14 may include a semiconductor material, such as SiGe or Si.

The second spacing layer 14 is first deposited on the n-well 12. The second channel layers 16 and the second spacing layers 14 are formed alternatively over each other, with the second channel layer 16 ends on top of the nanosheet stack 18. Three second spacing layers 14 and three second channel layers 16 are alternately arranged as illustrated in FIG. 2 as an example. More or less second spacing layers 14 and second channel layers 16 may be included in the nanosheet stack 18 depending on the desired number of channels in the semiconductor device to be formed. In some embodiments, the number of the second spacing layers 14 and second channel layers 16 is between 1 and 10.

The spacing layers 13, 14 and channel layers 15, 16 may be formed by a molecular beam epitaxy (MBE) process, a metalorganic chemical vapor deposition (MOCVD) process, and/or other suitable epitaxial growth processes.

In some embodiments, each channel layer 15, 16 has a thickness in a range between about 5 nm and about 30 nm. In other embodiments, each second channel layer 15, 16 has a thickness in a range between about 10 nm and about 20 nm. In some embodiments, each channel layer 15, 16 has a thickness in a range between about 6 nm and about 12 nm. In some embodiments, each channel layer 15, 16 has a thickness in a range between about 5 angstroms and about 2 nm when the channel layers 15, 16 are formed from two-dimensional materials. In some embodiments, the first channel layers 15 in the nanosheet stack 17 and the second channel layers 16 in the nanosheet stack 18 are uniform in thickness.

The spacing layers 13, 14 may eventually be removed and serve to define a vertical distance between adjacent channel regions for a subsequently formed multi-gate device. In some embodiments, the thickness of the spacing layer 13, 14 is equal to or greater than the thickness of the channel layer 15, 16. In some embodiments, each spacing layer 13, 14 has a thickness in a range between about 5 nm and about 50 nm. In other embodiments, each spacing layer 13, 14 has a thickness in a range between about 7 nm and about 30 nm.

The nanosheet stacks 17, 18 may be formed separately. For example, the nanosheet stack 17 is first formed over the entire substrate, i.e. over both the n-well 12 and the p-well 11 then recesses are formed in the semiconductor stack 17 in areas over the n-well 12 to expose the n-well 12, and the nanosheet stack 18 is then formed in the recesses over the n-well 12 while the nanosheet stack 17 is covered by a mask layer.

At operation 104, a top spacing layer 20 is formed over the nanosheet stacks 17 and 18 on the channel layers 15 and 16 respectively, and a hard mask layer 22 is formed on the top spacing layer 20, as shown in FIG. 2.

The top spacing layer 20 may be formed over the nanosheet stacks 17 and 18 during the same deposition process or in two separated deposition processes. The top spacing layer 20 may be formed from a material that may be selectively removed from the channel layers 15 and 16 during subsequent processing for inner spacer formation and for replacement gate formation.

In some embodiments, the top spacing layer 20 is formed from the same material as the first and second spacing layers 13, 14. For example, the top spacing layer 20 may include silicon germanium (SiGe), such as a SiGe layer including Ge in a molar ratio in a range between 25% and 50%. In other embodiments, when the channel layers 15, 16 include two dimensional materials, the top spacing layer 20 may include a metal, such as Cu, Ni, or a metal oxide, such as $Al_2O_3$, $HfO_2$ etc.

The hard mask layer 22 is deposited over the top spacing layer 20. The hard mask layer 22 may be any suitable material allowing selective removal of the spacing layers 13, 14, 20 during formation of inner spacers, replacement gate, and serving as etch stop during gate electrode etch back. In some embodiments, the hard mask layer 22 includes silicon oxide, silicon nitride, silicon oxynitride, or a combination thereof.

The top spacing layer 20 has a thickness T1 in a range to allow formation of gate dielectric and gate electrode layer on the topmost channel layers 15, 16 during replacement gate formation. In some embodiments, the thickness T1 is substantially the same as the first and second spacing layers 13, 14. In some embodiments, the thickness T1 is in a range between about 7 nm and about 9 nm. A thickness less than 7 nm may be not enough to form a gate dielectric layer and gate electrode of desirable quality. A thickness more than 9 nm may increase the device dimension without additional performance benefit.

The hard mask layer 22 has a thickness T2 in a range between about 5 nm and 7 nm. In some embodiments, the hard mask layer 22 is used to control gate height during gate etch back process. In some embodiments, the thickness T2 is in a range between about 5 nm and about 7 nm. A thickness less than 5 nm may not be enough to function as an etch stop. A thickness more than 7 nm may increase the device dimension without additional performance benefit.

Figure 3:
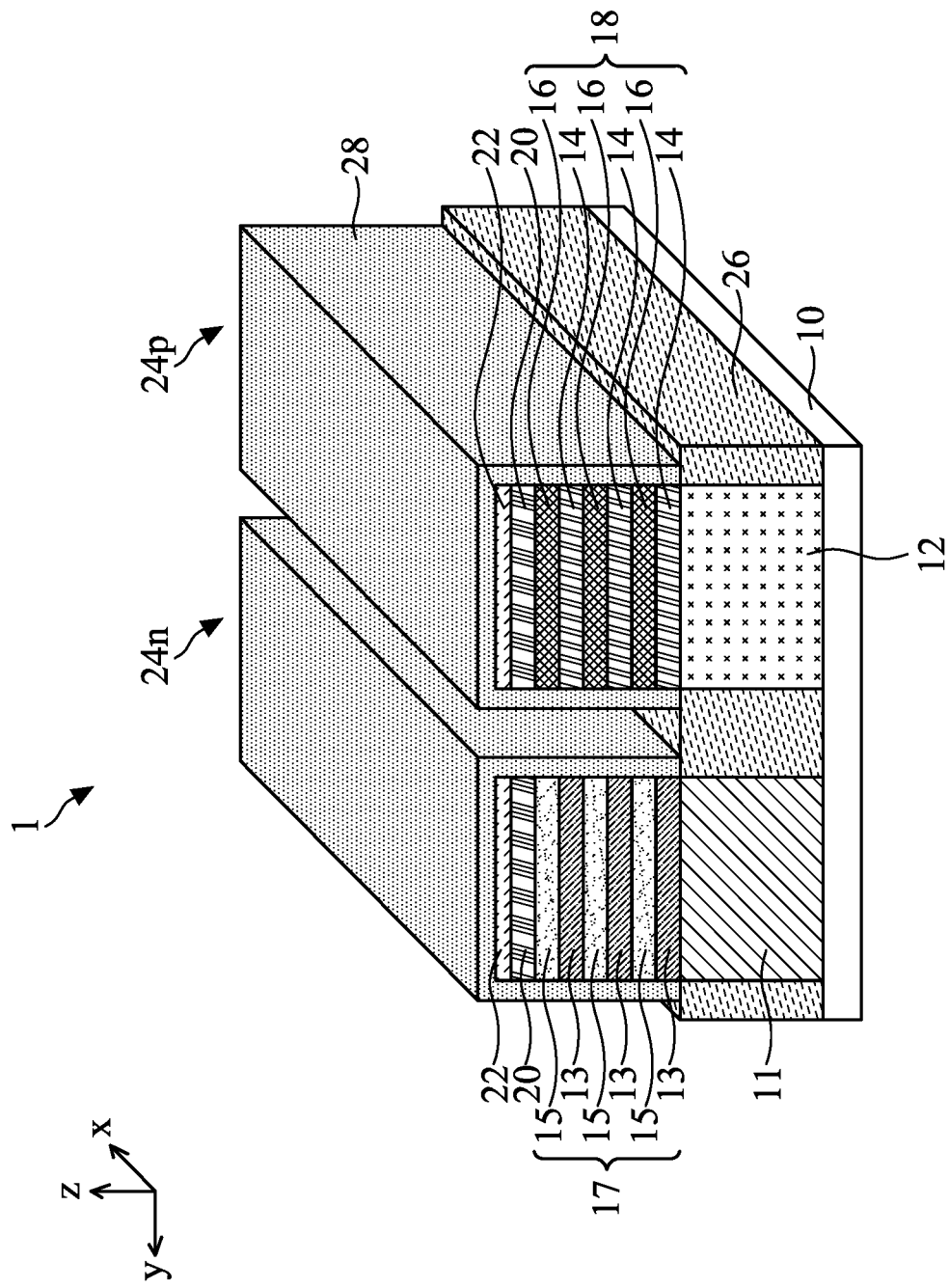

At operation 106, fin structures 24n, 24p are formed from the nanosheet stacks 17, 18, the top spacing layer 20, and the hard mask layer 22, as shown in FIG. 3. The fin structure 24n may be formed by patterning and etching the hard mask layer 22, the top spacing layer 20, and the nanosheet stacks 17, 18 by one or more etching processes. In FIG. 3, the fin structures 24n, 24p are formed along the X direction.

At operation 108, an isolation layer 26 is formed in the trenches between the fin structures 24n, 24p, and a cladding layer 28 is formed to cover a portion of the fin structures 24n, 24p, as shown in FIG. 3. The isolation layer 26 is formed over the substrate 10 to cover part of the fin structures 24n, 24p with the nanosheet stacks 17, 18 exposed. The isolation layer 26 may be formed by a high density plasma chemical vapor deposition (HDP-CVD), a flowable CVD (FCVD), or other suitable deposition process. In some embodiments, the isolation layer 26 may include silicon oxide, silicon nitride, silicon oxynitride, fluorine-doped silicate glass (FSG), a low-k dielectric, combinations thereof. In some embodiments, the isolation layer 26 is formed to cover the fin structures 24n, 24p by a suitable deposition process to fill the trenches between the fin structures 24n, 24p, and then recess etched using a suitable anisotropic etching process to expose the nanosheet stacks 17, 18 of the fin structures 24n, 24p.

The cladding layer 28 is then formed on sidewalls of the fin structures 24n, 24p. The cladding layer 28 may be formed by an epitaxial process over exposed portion of the fin structures 24n, 24p as shown in FIG. 3. In some embodiments, a semiconductor liner (not shown) may be first formed over the fin structures 24n, 24p, and the cladding layer 28 is then formed over the semiconductor liner by an epitaxial process. In some embodiments, the cladding layer 28 includes a semiconductor material, for example SiGe. In some embodiments, the cladding layer 28 may have a composition similar to the composition of the first spacing layer 13, the second spacing layer 14, and the top spacing layer 20, thus may be selectively removed from the first channel layer 15 and the second channel layer 16. In an alternative embodiment, the semiconductor liner may be omitted and the cladding layer 28 be epitaxially grown from the exposed surfaces of the spacing layers 13, 14, 20 and the channel layers 15, 16.

Figure 4:
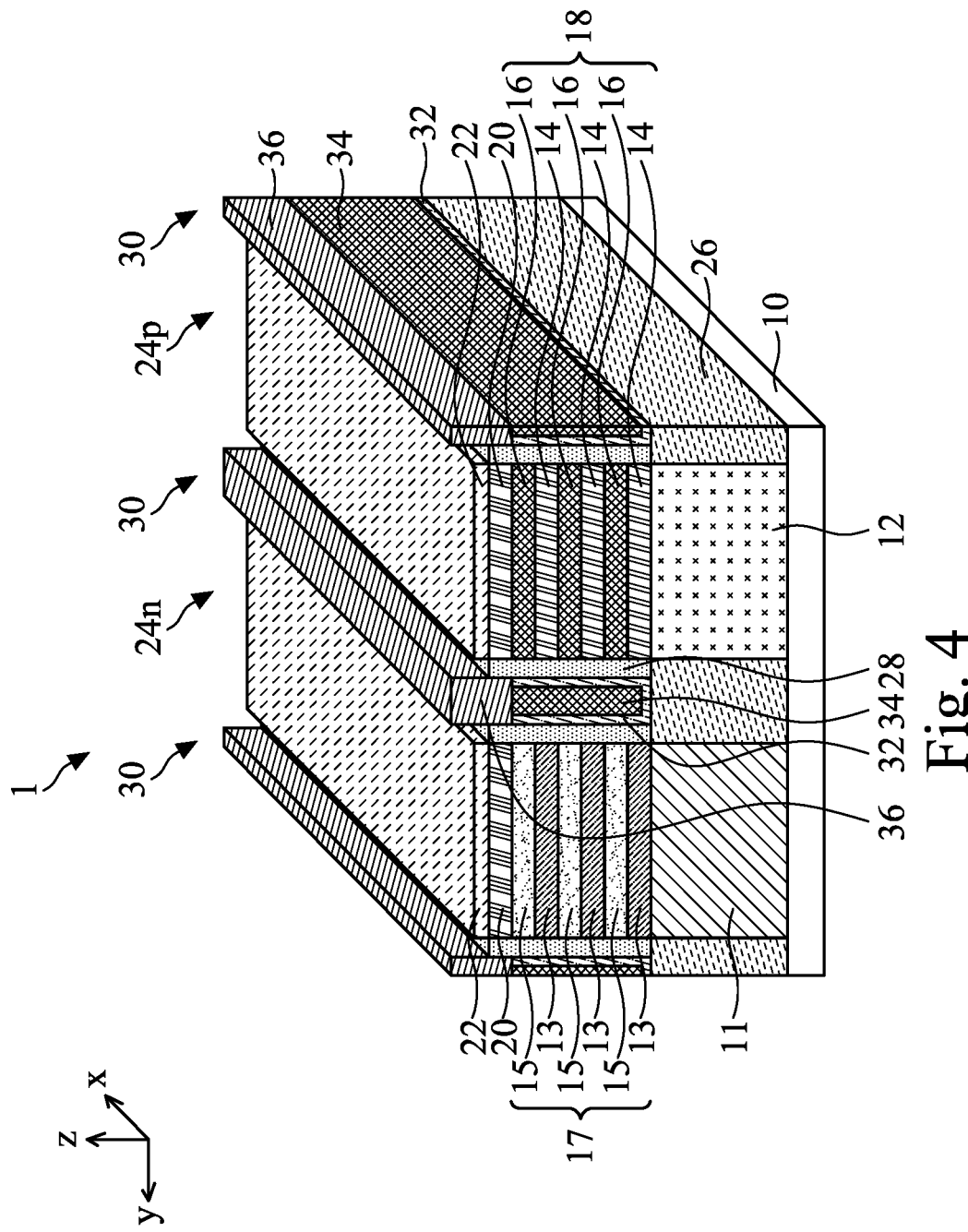

At operation 110, hybrid fins 30 are formed in the trenches between the neighboring fin structures 24n, 24p after formation of the cladding layer 28 and high-k dielectric features 36 are formed over the hybrid fins 30, as shown in FIG. 4. The hybrid fins 30, also referred to as dummy fins or dielectric fins, include a high-k dielectric material layer, a low-k dielectric material layer, or a bi-layer dielectric material including high-k upper part and a low-k lower part. In some embodiments, the hybrid fins 30 include a high-k metal oxide, such as $HfO_2$, $ZrO_2$, HfAlOx, HfSiOx, $Al_2O_3$, and the like, a low-k material such as SiONC, SiCN, SiOC, or other dielectric material. In the example of FIG. 4, the hybrid fin 30 is a bi-layer structure including a dielectric liner layer 32 and a dielectric filling layer 34. In some embodiments, the dielectric liner layer 32 may include a low-k material, such as SiONC, SiCN, SiOC, or other dielectric material, that provide etch resistance during replacement gate processes. The dielectric filling layer 34 may be a dielectric material, such as silicon oxide. After formation of the dielectric filling layer 34, a planarization process is performed to expose the cladding layer 28.

The hybrid fins 30 are then recess etched by any suitable process, such as dry etch, wet etch, or a combination thereof. The etch process may be a selective etch process that does not remove the semiconductor material of the cladding layer 28. The recess process may be controlled so that the dielectric liner layer 32 and the dielectric filling layer 34 are substantially at the same level as a top surface of the topmost first channel layer 15 and the topmost second channel layer 16. As a result of the recess etch, recesses are formed on the hybrid fins 30.

The high-k dielectric features 36 are formed in the recesses over the hybrid fins 30, as shown in FIG. 4. In some embodiments, the high-k dielectric features 36 are formed by a blanket deposition followed by a planarization process. The high-k dielectric features 36 may include a material having a k value greater than 7, such as $HfO_2$, $ZrO_2$, HfAlOx, HfSiOx, or $Al_2O_3$. Any suitable deposition process, such as a CVD, PECVD, FCVD, or ALD process, may be used to deposit the high-k dielectric material. After formation of the high-k dielectric features 36, the cladding layer 28 may be recessed to level with the top spacing layer 20. The high-k dielectric features 36 protrude over the fin structures 24n, 24p and the hybrid fins 30 and may function to separate gate structures formed over the fin structures 24n, 24p.

Figure 5:
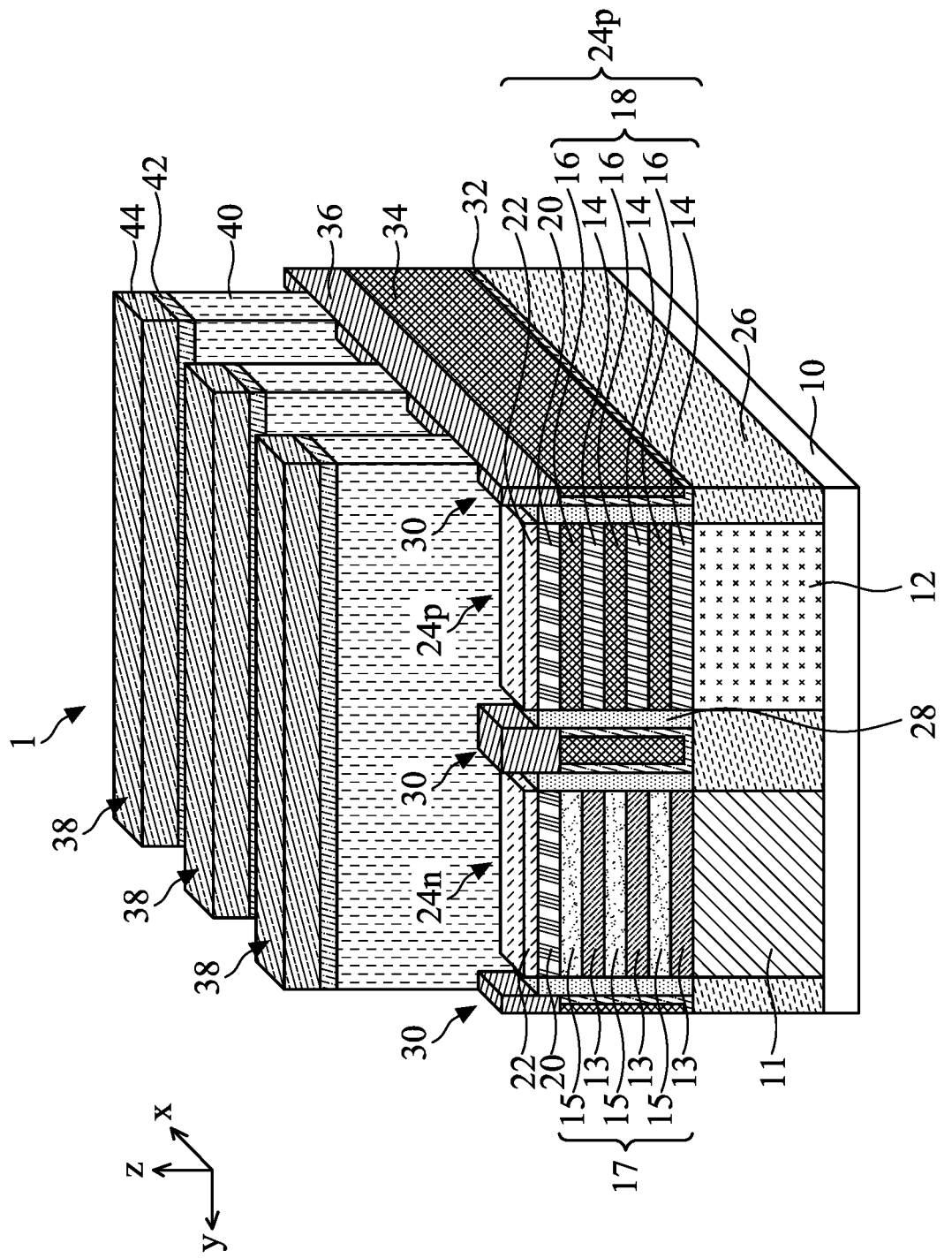

At operation 112, sacrificial gate structures 38 are formed as shown in FIG. 5. The sacrificial gate structures 38 are formed over the fin structures 24n, 24p and the hybrid fins 30. The sacrificial gate structure 38 is formed over a portion of the fin structures 24n, 24p which is to be a channel region. The sacrificial gate structure 38 may include a sacrificial gate electrode layer 40, a pad layer 42, and a mask layer 44.

The sacrificial gate electrode layer 40 may be formed over the fin structures 24n, 24p, the high-k dielectric features 36. In some embodiments, the sacrificial gate dielectric layer (not shown) may be conformally formed over the fin structures 24n, 24p, the high-k dielectric features 36 prior to forming the sacrificial gate electrode layer 40. The sacrificial gate electrode layer 40 includes silicon such as polycrystalline silicon or amorphous silicon. The thickness of the sacrificial gate electrode layer is in a range between about 70 nm and about 200 nm. In some embodiments, the sacrificial gate electrode layer 40 is subjected to a planarization operation. The sacrificial gate electrode layer 40 may be deposited using CVD, including LPCVD and PECVD, PVD, ALD, or other suitable process. Subsequently, the pad layer 42 and the mask layer 44 are formed over the sacrificial gate electrode layer 02. The pad layer 42 may include silicon nitride. The mask layer 44 may include silicon oxide. Next, a patterning operation is performed on the mask layer 44, the pad layer 42, the sacrificial gate electrode layer 40 to form the sacrificial gate structure 38.

Figure 6:
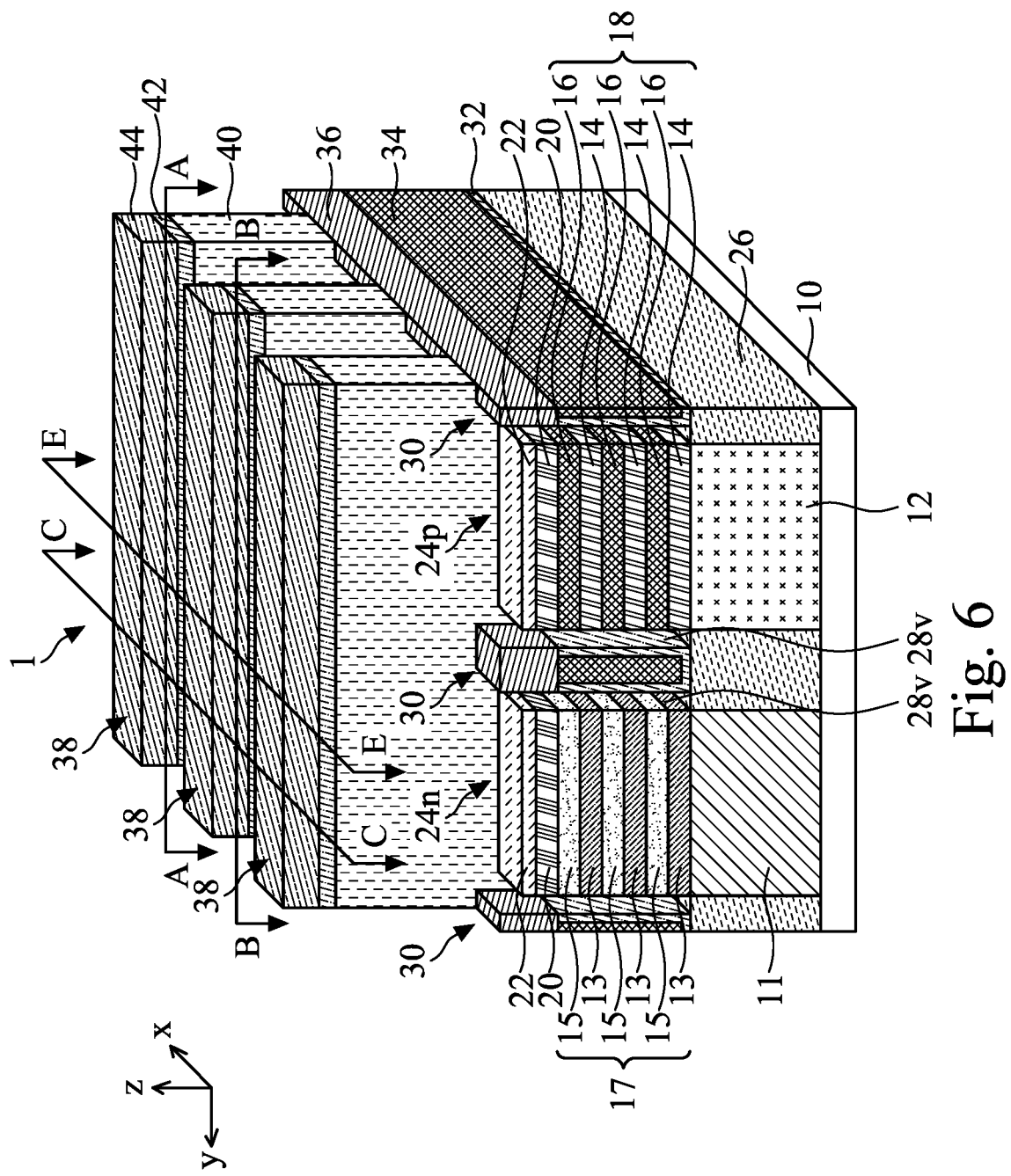

At operation 114, exposed portions of the cladding layer 28 is removed from sidewalls of exposed fin structures 24n, 24p, as shown in FIG. 6. After removal of the cladding layer 28, spaces 28v are on sidewalls of the fin structures 24n, 24p for subsequent formation of fin sidewall (FSW) spacers. The portions of the cladding layers 28 may be removed by any suitable etching methods.

Lines A-A, B-B, C-C, and E-E in FIG. 6 and D-D in FIG. 7B indicate cut lines of various views in FIGS. 7A-7E to FIGS. 17A-C described below. Particularly, FIGS. 7A-17A are schematic cross-sectional views along lines A-A in FIG. 6, FIGS. 7B-17B are schematic cross-sectional views along lines B-B in FIG. 6, FIGS. 7C-17C are schematic cross-sectional views along lines C-C in FIG. 6, FIGS. 7D-9D, 11D, and 14D-15D are schematic cross-sectional views along lines D-D in FIG. 7B, and FIGS. 7E and 8E are schematic cross-sectional views along lines E-E in FIG. 6.

At operation 116, a sidewall spacer layer 46 is formed over exposed surfaces of the sacrificial gate structures 38 and the fin structures 24n, 24p, as shown in FIGS. 7A-7E. After the sacrificial gate structures 38 are formed and the cladding layer 28 adjacent the exposed fin structures 24n, 24p are removed, the sidewall spacer layer 46 is formed by a blanket deposition of an insulating material. In some embodiments, the insulating material of the sidewall spacer layer 46 is a silicon nitride-based material, such as SiN, SiON, SiOCN or SiCN and combinations thereof.

Figure 7A:
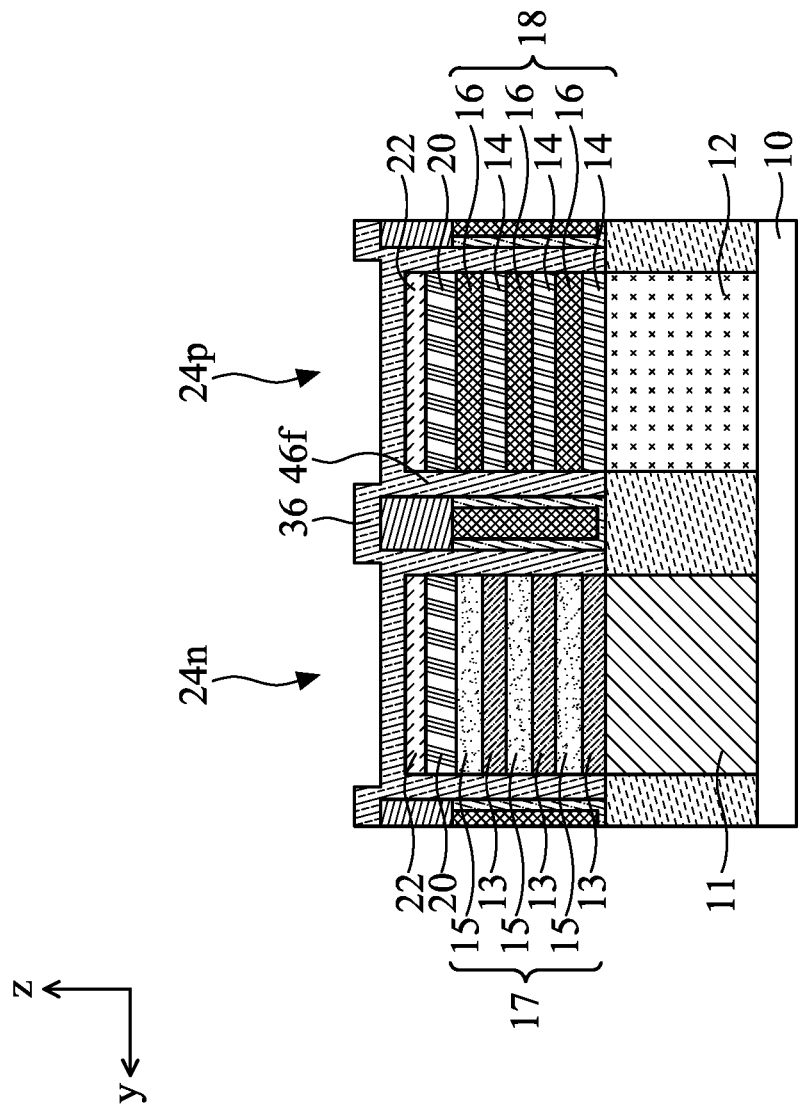
Figure 7B:
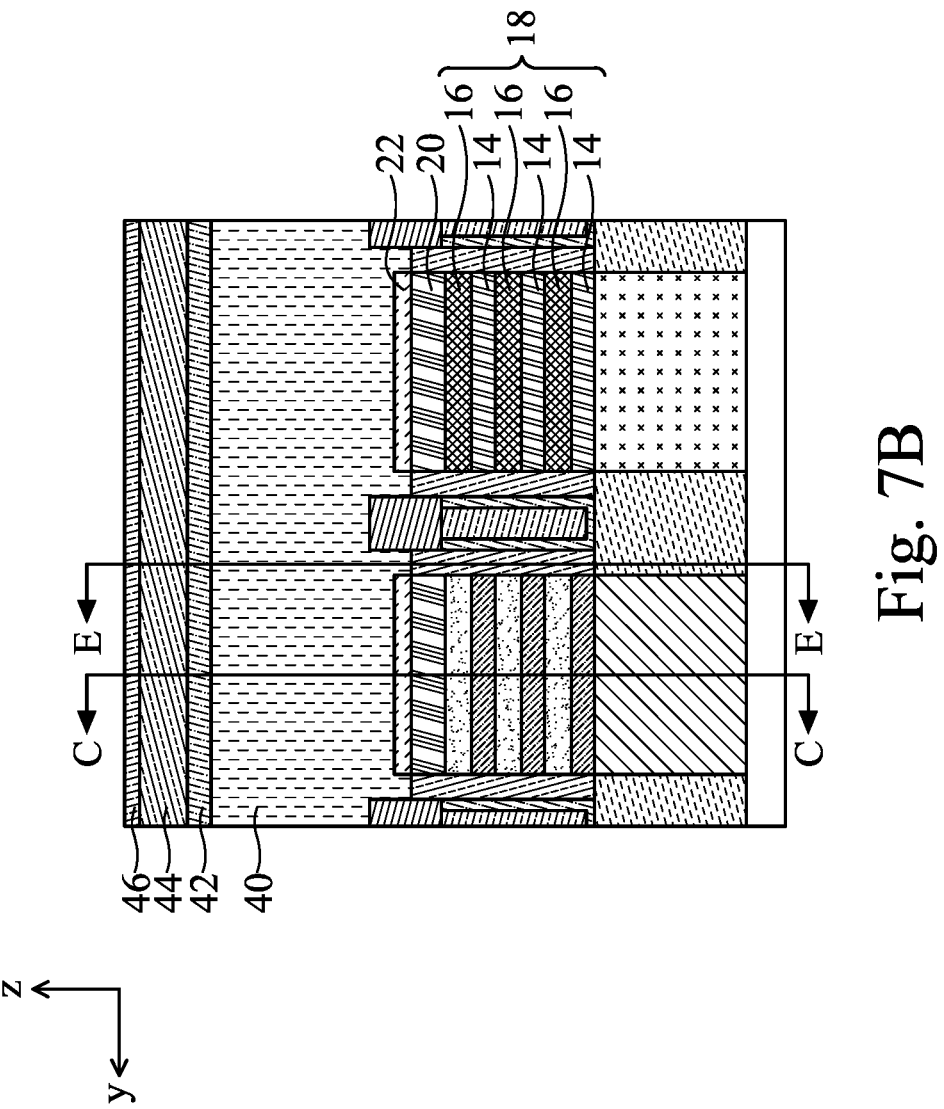
Figure 7C:
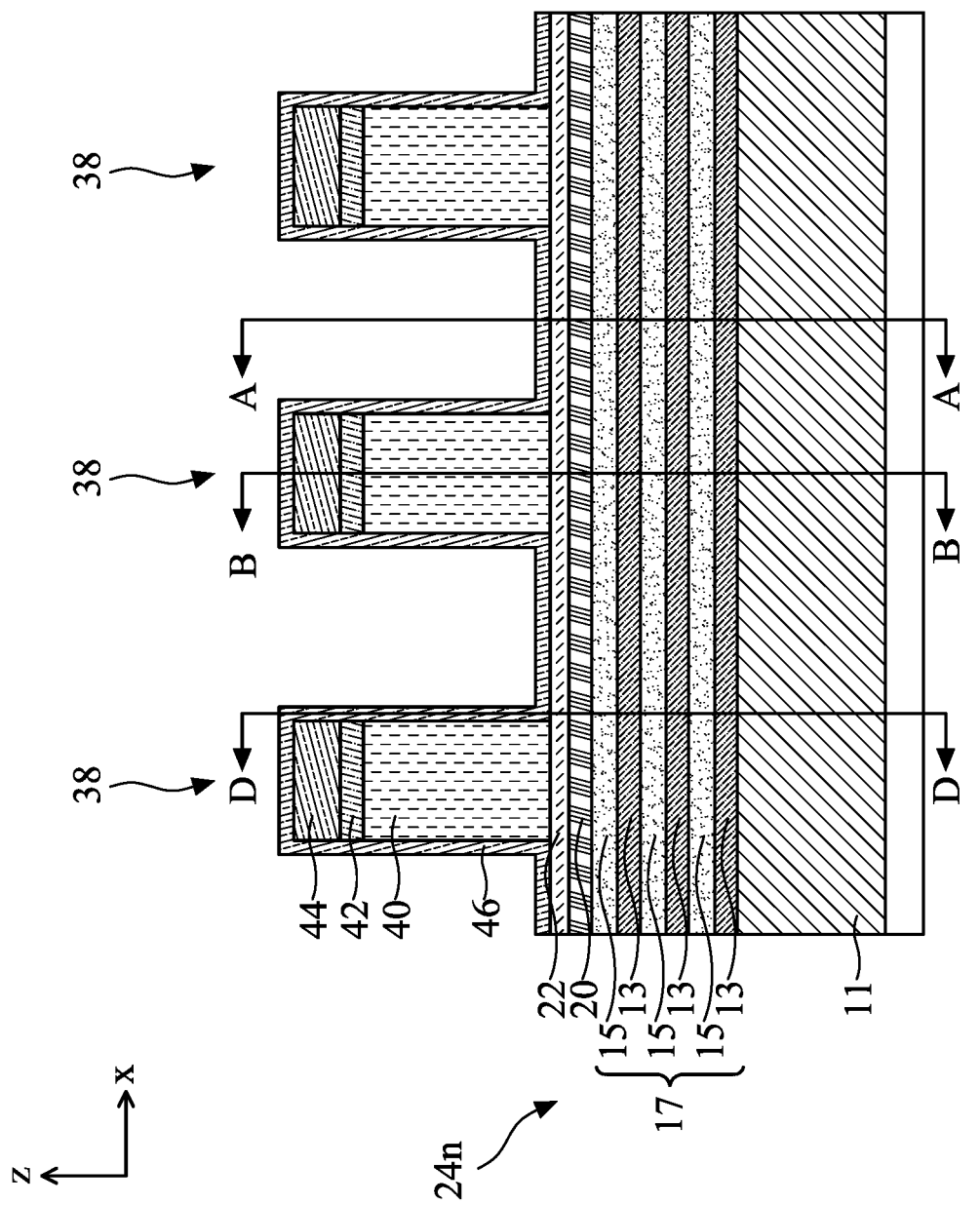
Figure 7D:
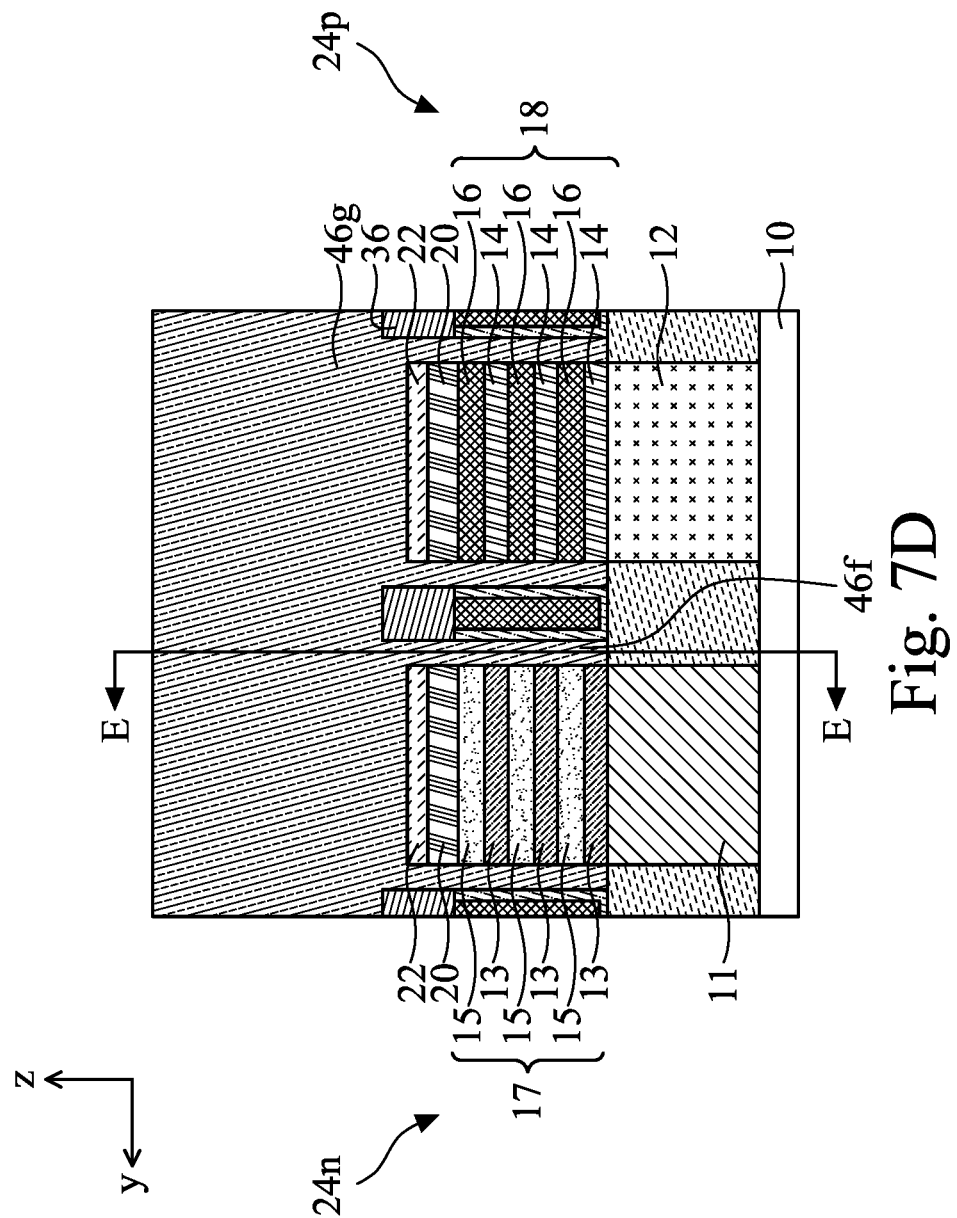
Figure 7E:
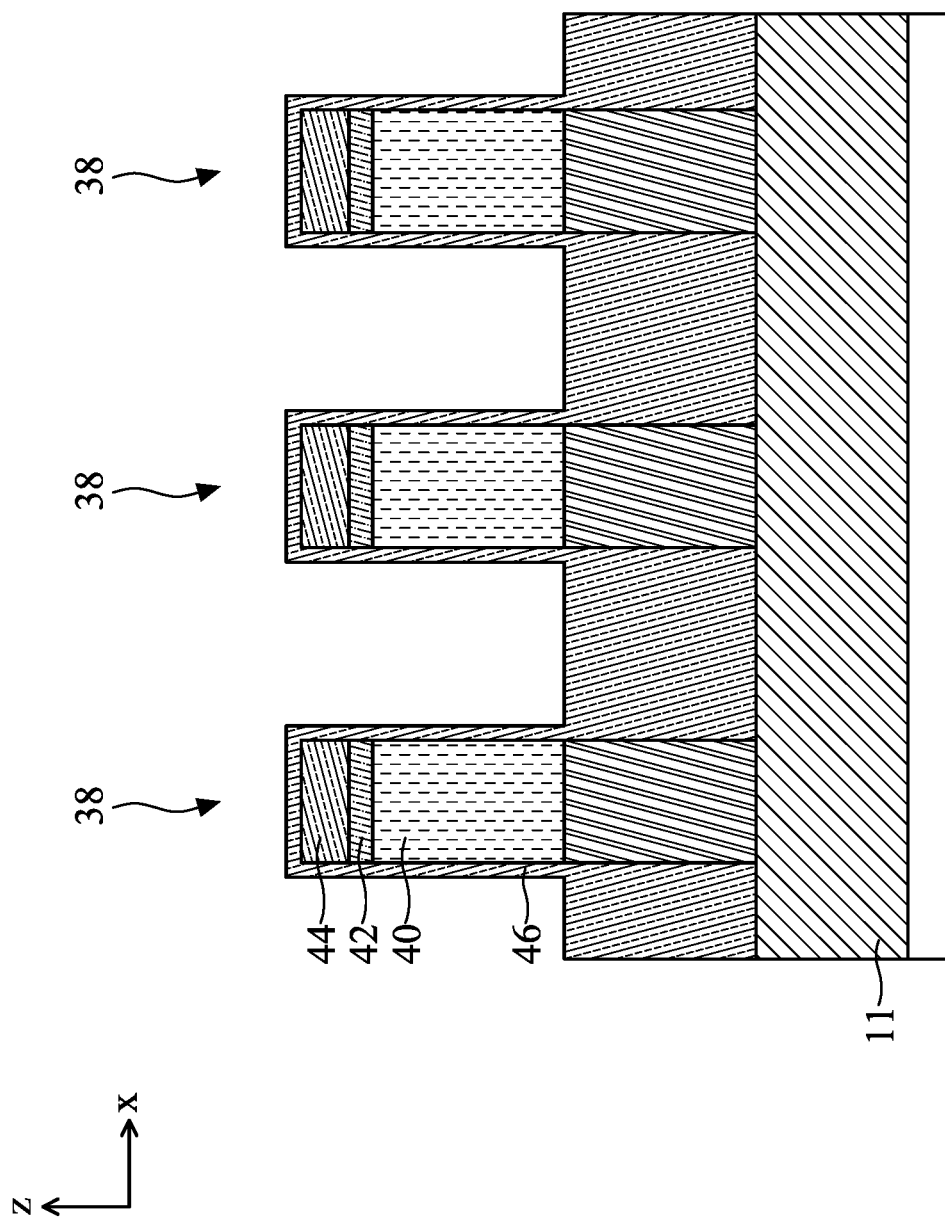

As shown in FIG. 7A, the spaces 28v are filled with the sidewall spacer layer 46. Portions of the sidewall spacer layer 46 on sidewalls of the sacrificial gate structures 38 are referred as gate sidewall spacer 46g and portions of the sidewall spacer layer 46 filled in the spaces 28v are referred as fin sidewall spacer 46f. The sidewall spacer layers 46 deposited on horizontal surfaces is subsequently removed. In some embodiments, formation of the sidewall spacer layer 46 is followed by anisotropic etch to remove insulating material from horizontal surfaces. In other embodiments, portions of the sidewall spacer layer 46 on horizontal surfaces are removed during subsequent source/drain region etch back section.

At operation 118, the fin structure 24n is recess etched to form source/drain recesses 48 over the p-well 11, on which n-type devices are to be formed, as shown in FIGS. 8A-8E. A sacrificial liner 50 and a photoresist layer 52 may be formed and patterned to expose regions over the p-well 11 for processing. The sacrificial liner 50 may be a dielectric layer used to protect regions not being processed. In some embodiment, the sacrificial liner 50 includes silicon nitride.

Figure 8A:
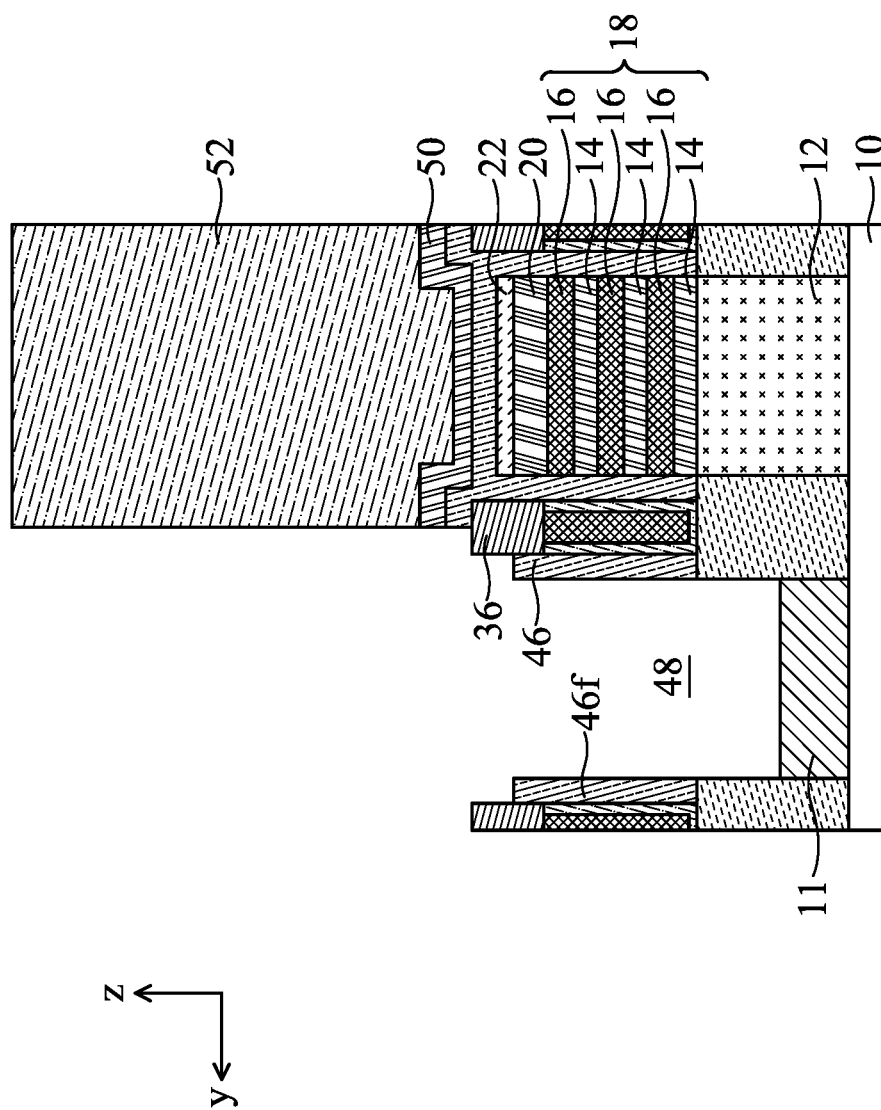
Figure 8B:
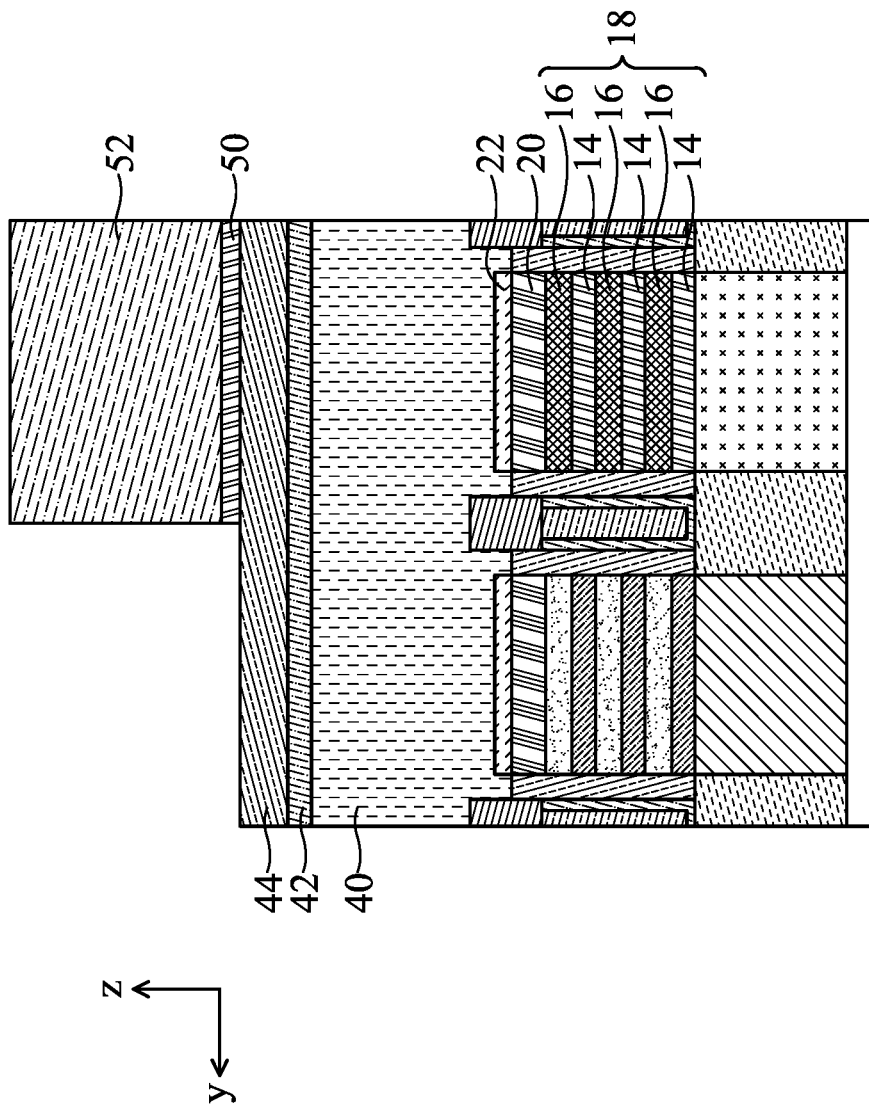
Figure 8C:
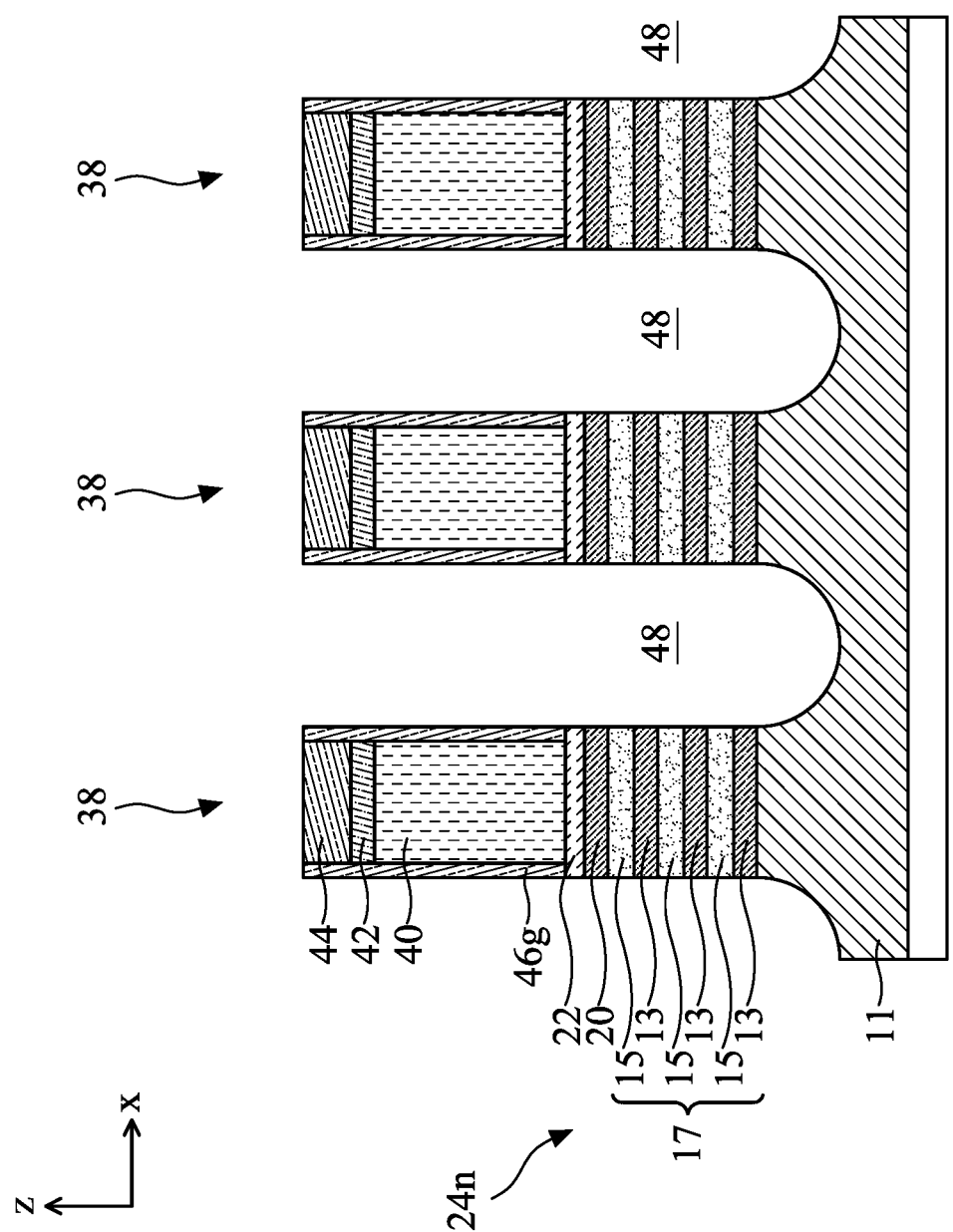
Figure 8D:
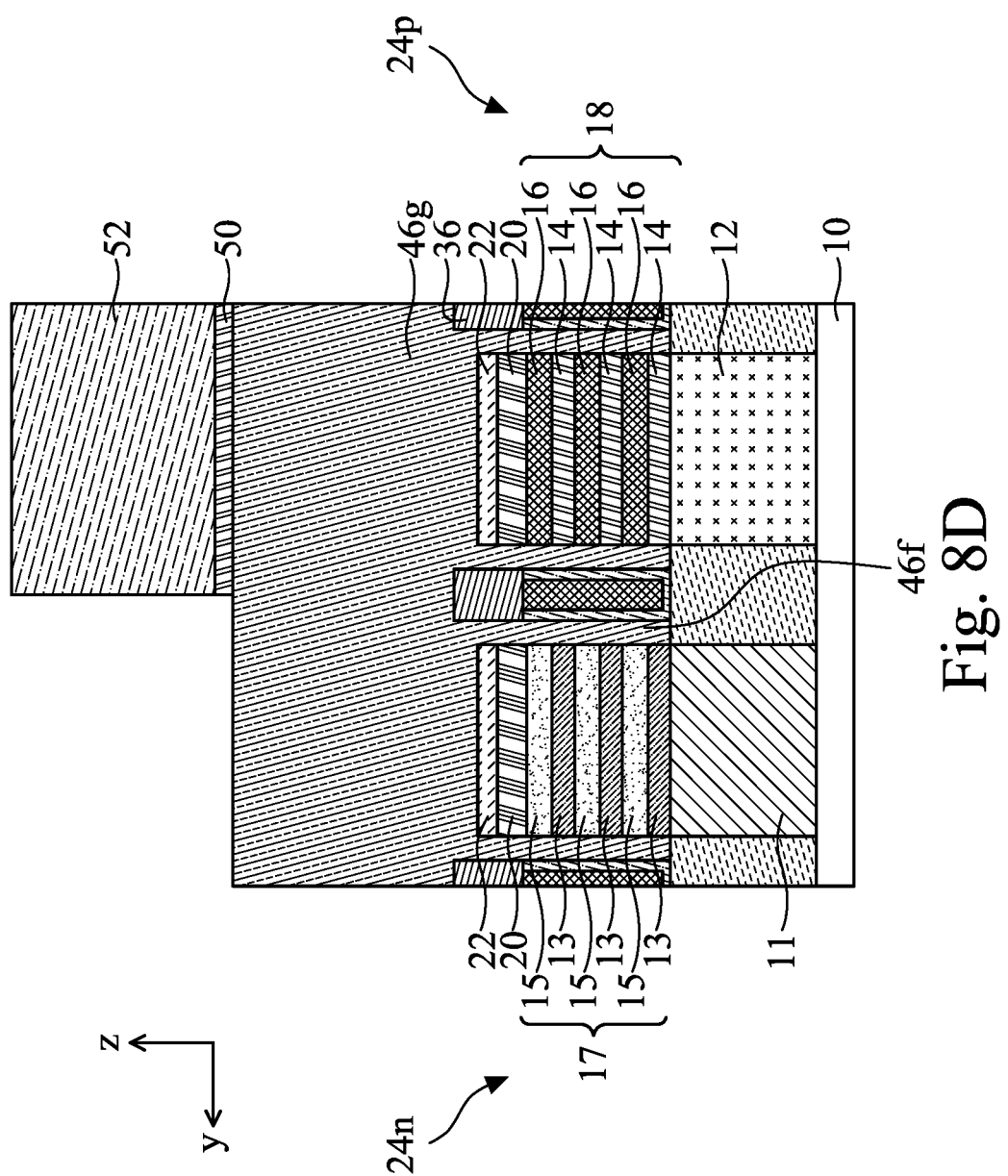

The fin structure 24n on opposite sides of the sacrificial gate structure 38 are etched to form the source/drain recesses 48 between the fin sidewall spacers 48f on either side of the sacrificial gate structure 38 as shown in FIGS. 8A and 8C.

The hard mask layer 22, the top spacing layer 20, the first spacing layers 13 and the first channel layers 15 in the fin structure 24n are etched down on both sides of the sacrificial gate structure 38 using etching operations. In some embodiments, all layers in the nanosheet stack 17 of the fin structure 24n and part of the p-well 11 under the fin structure 24n are removed to form the source/drain recesses 48. In some embodiments, suitable dry etching and/or wet etching may be used to remove the layers, together or separately.

At operation 120, inner spacers 54 are formed as shown in FIGS. 9A-9D. Prior to forming the inner spacers 54, the photoresist layer 52 may be removed exposing the patterned sacrificial liner 50 to protect regions over the n-well 12. Portions of the first spacing layers 13 and top spacing layer 20 which are exposed to the source/drain recesses 48 are first etched horizontally along the X direction to form cavities. In some embodiments, the first spacing layers 13 and top spacing layer 20 can be selectively etched by using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions. In some embodiments, an etching thickness of the first spacing layers 13 and top spacing layer 20 is in a range between about 2 nm and about 10 nm along the X direction.

After forming the spacer cavities by etching the first spacing layers 13 and top spacing layer 20, the inner spacers 54 are formed in the spacer cavities by conformally deposit and then partially remove an insulating layer. The insulating layer can be formed by ALD or any other suitable method. The subsequent etch process removes most of the insulating layer except inside the cavities, resulting in the inner spacers 54. In some embodiments, the first channel layers 15 may extend from the inner spacers 54. In some embodiments, the inner spacers 54 may include one of silicon nitride (SiN) and silicon oxide ($SiO_2$), SiONC, or a combination thereof. The inner spacers 54 have a thickness along the X direction in a range from about 4 nm to about 7 nm. In some embodiments, the inner spacers 54 may be subsequently removed to form inner spacing airgaps. In other embodiments, the inner spacers 54 may remain in the semiconductor device 1.

Figure 9A:
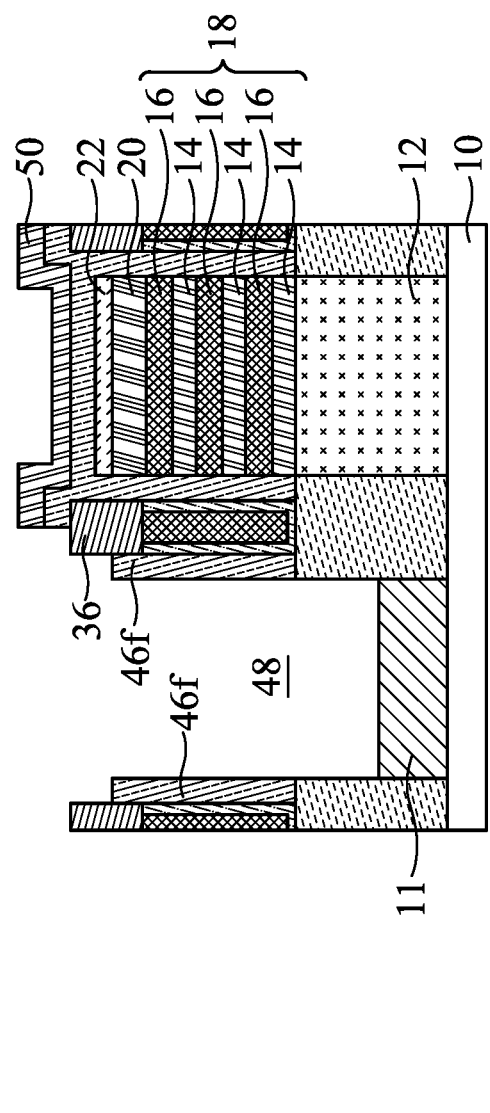
Figure 9C:
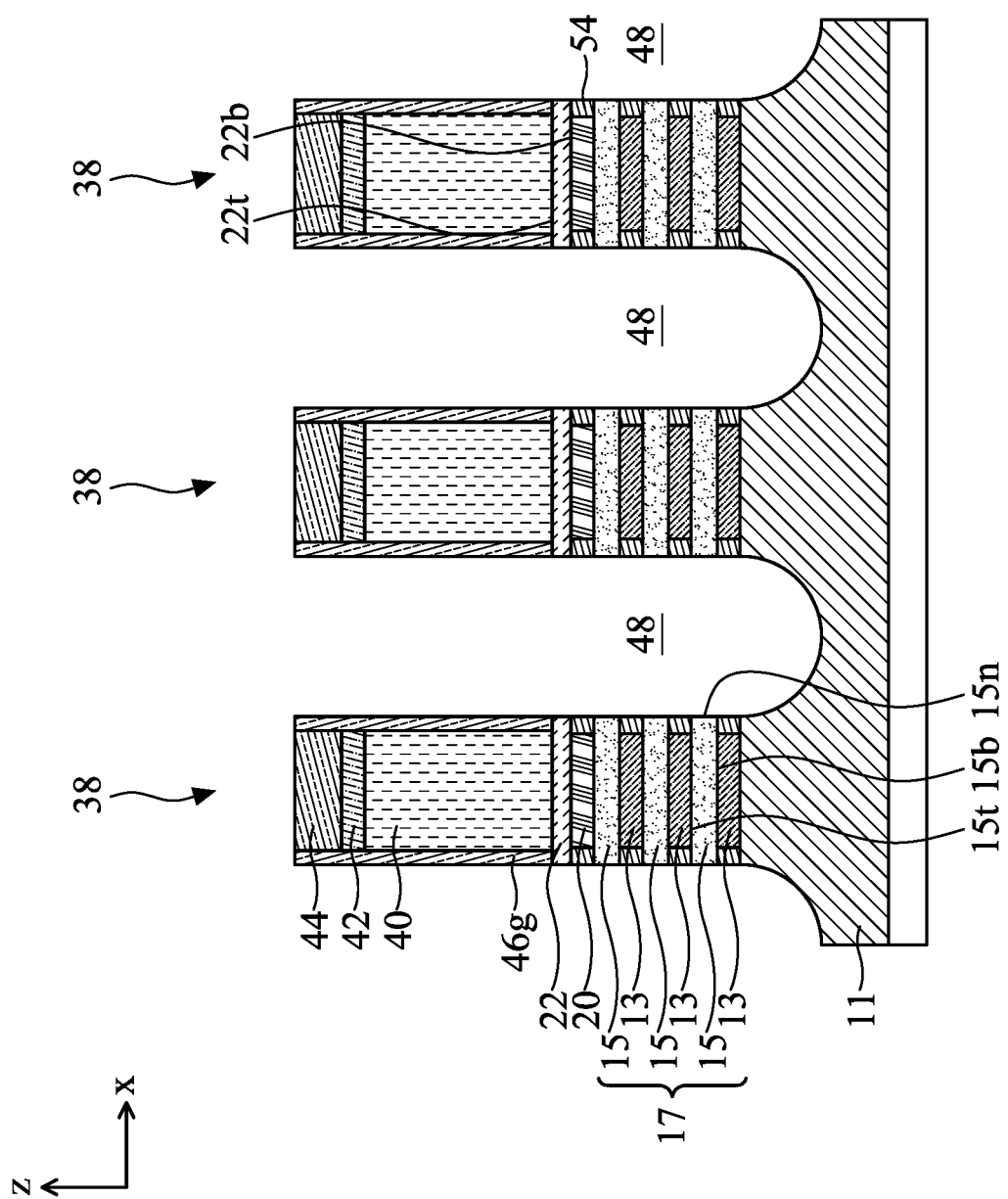
Figure 9D:
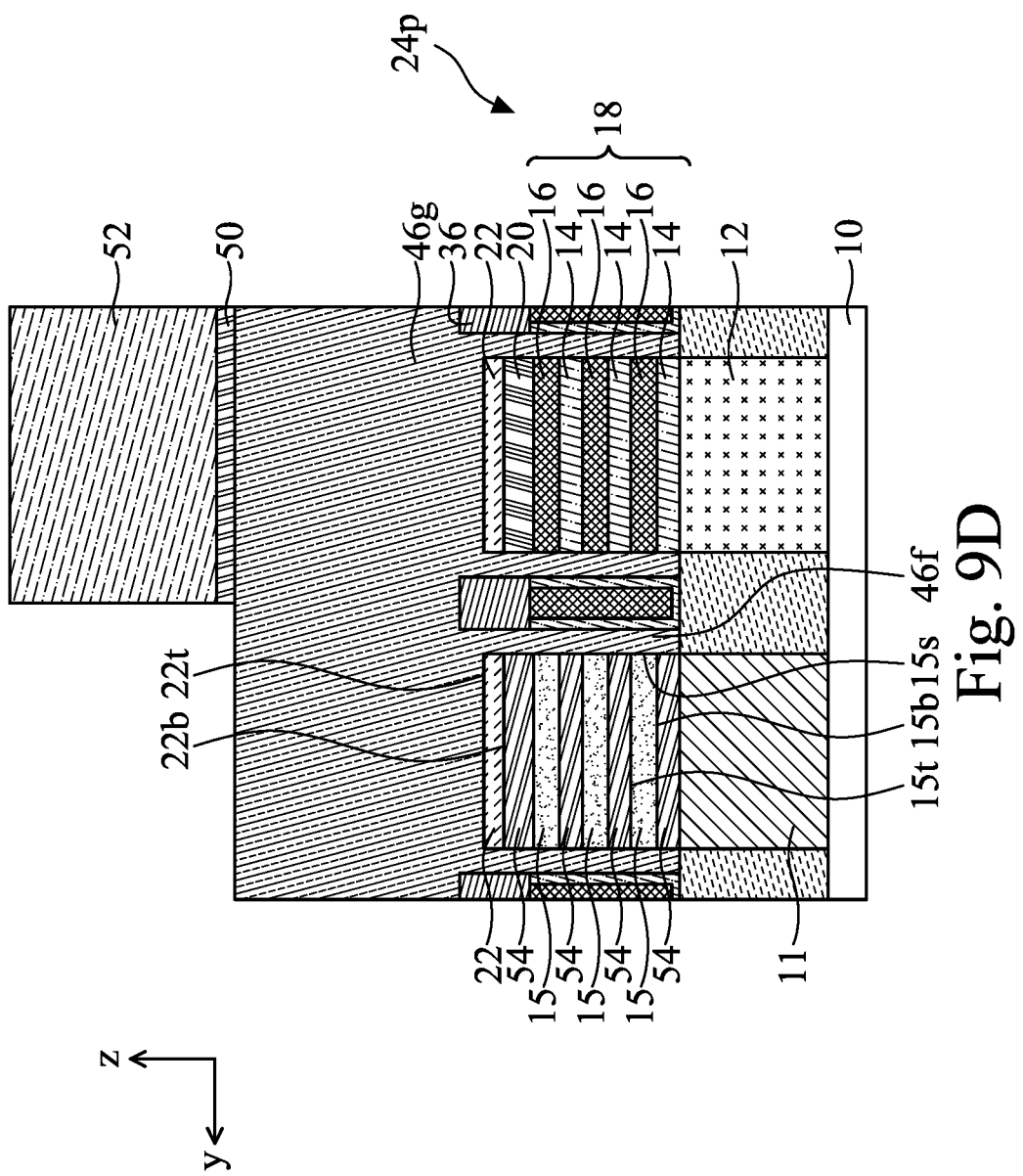

Because of the top spacing layer 20 is formed over the topmost first channel layer 15, end portions of every channel layer 15 is sandwich between two inner spacers 54, as shown in FIGS. 9C and 9D. Particularly, each first channel layer 15 has a top surface 15t and a bottom surface 15b. Prior to forming the inner spacers 54, the top surface 15t of the topmost first channel layer 15 is in contact with the top spacing layer 20 and the bottom surface 15b of the topmost first channel layer 15 is in contact with one first spacing layer 13, while all other first channel layers 15 are in contact with a first spacing layer 13 on both the top surface 15t and the bottom surface 15b.

After formation of the inner spacers 54, end portions or portions under the gate sidewall spacers 46g of each first channel layer 15 is in contact with a corresponding inner spacer 54 on both the top surface 15t and the bottom surface 15b. As shown in FIG. 9D, end portions of portions under the gate sidewall spacers 46g of each first channel layer 15 are surrounded by spacers on all sides. Particularly, the top surface 15t and bottom surface 15b are in contact with the inner spacers 54. Side surfaces 15s connecting the top surface 15t and the bottom surface 15b are in contact with fin sidewall spacer 46f.

End portions of the hard mask layer 22 or portions of the hard mask layer 22 under the gate sidewall spacers 46g, which is formed over the topmost first/second channel layers 15/16, are in contact with the gate sidewall spacer 46g on a top surface 22t and in contact with the topmost inner spacer 54 at a bottom surface 22b. Side surfaces connecting the top surface 22t and the bottom surface 22b are in contact with fin sidewall spacer 46f. The inner spacer 54 between the bottom surface 22b of the hard mask layer 22 and the topmost channel layers 15/16 provide additional insolation between the source/drain features and metal gate structures to be formed, thus, improve product performance.

Figure 10A:
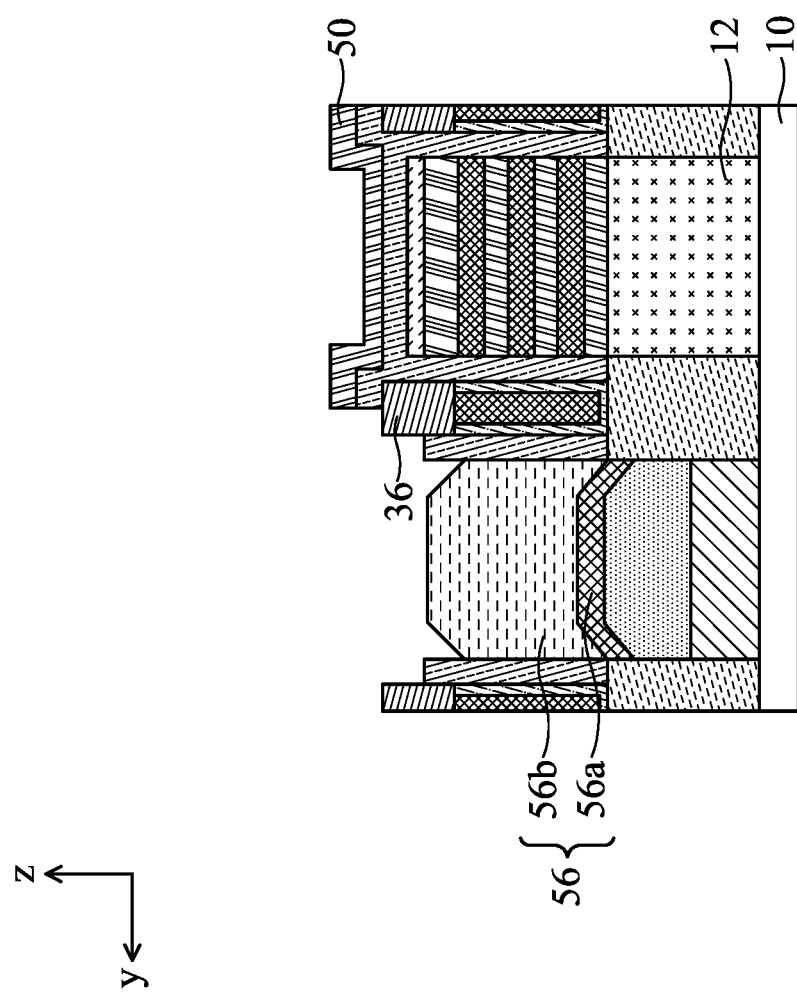
Figure 10B:
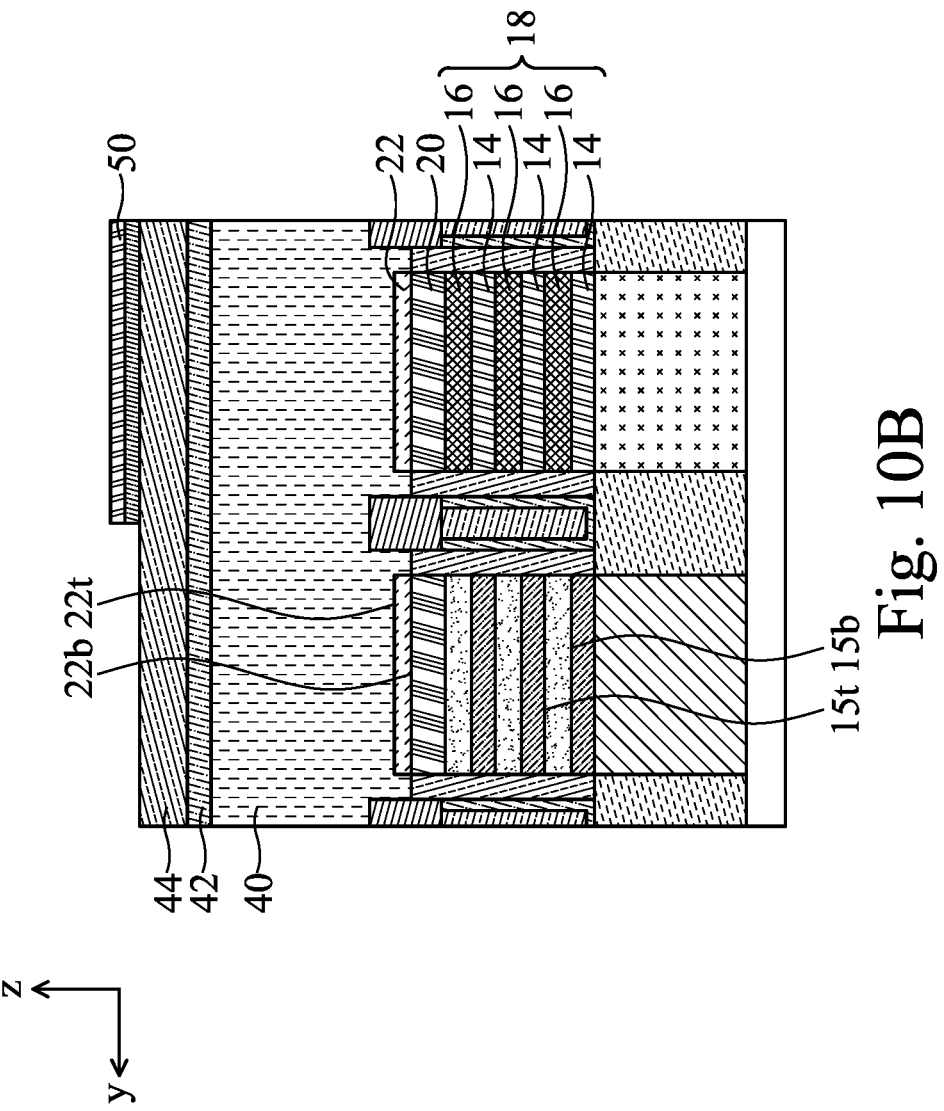
Figure 10C:
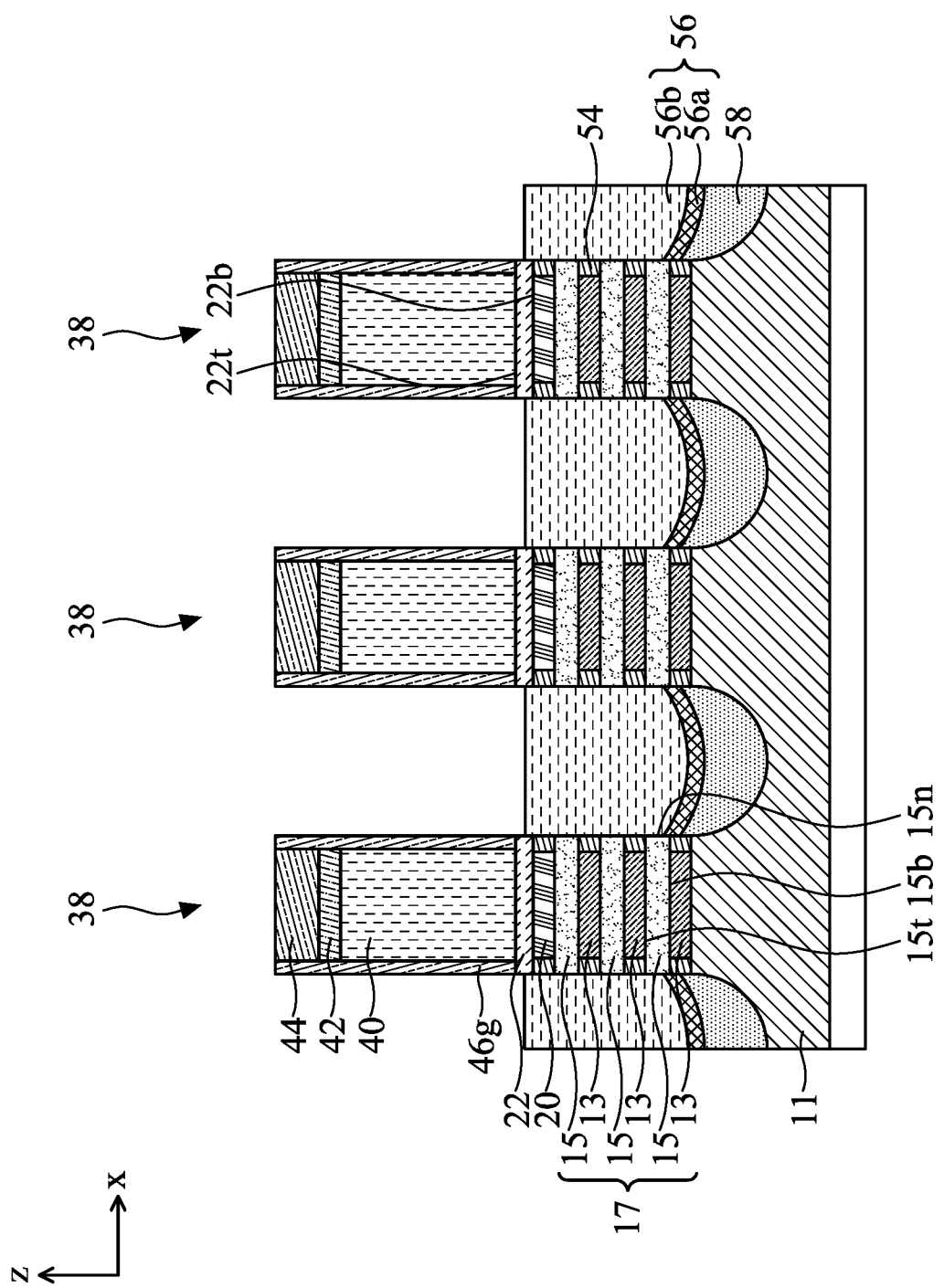

At operation 122, epitaxial source/drain features 56 are formed in the source/drain recess 48, as shown in FIGS. 10A-10C. In some embodiments, optional backside contact alignment features 58 are selectively formed under the source/drain 56 where the source/drain features 56 are to be connected to a backside power rail.

The backside contact alignment feature 58 may be formed by any suitable method, such as by CVD, CVD epitaxy, molecular beam epitaxy (MBE), or any suitable deposition technique. The backside contact alignment feature 58 may be an undoped semiconductor material. In some embodiments, the backside contact alignment feature 58 may include SiGe, such as a single crystal SiGe material. In some embodiments, the backside contact alignment feature 58 is formed from SiGe having a germanium composition percentage between about 50% and 95%. Alternatively, the backside contact alignment feature 58 may include other materials such as Si, Ge, a compound semiconductor such as SiC, GeAs, GaP, InP, InAs, and/or InSb, an alloy semiconductor such as GaAsP, AlInAs, AlGaAs, InGaAs, GaInP, and/or GaInAsP, or combinations thereof.

The epitaxial source/drain feature 56 may include a transitional epitaxial layer 56a and an epitaxial source/drain layer 56b. The transitional epitaxial layer 56a may be formed by any suitable method, such as by CVD, CVD epitaxy, molecular beam epitaxy (MBE), or any suitable deposition technique. The transitional epitaxial layer 56a can serve to gradually change the lattice constant from that of the backside contact alignment feature 58 (when present) or the p-well 11 to that of the epitaxial source/drain layers 56b. In some embodiments, the transitional epitaxial layer 56a may be a semiconductor material with a lattice structure similar to the semiconductor material configured to function as a source/drain feature for a n-type device. In some embodiments, the transitional epitaxial layer 56a may be a semiconductor material includes n-type dopants at a dopant concentration lower than a dopant concentration used in a source/drain feature. The transitional epitaxial layer 56a may include one or more layers of Si, SiP, SiC and SiCP. The transitional epitaxial layer 56a also include n-type dopants, such as phosphorus (P), arsenic (As), etc. In some embodiments, the transitional epitaxial layer 56a may be a Si layer including phosphorus dopants.

The epitaxial source/drain layers 56b are formed in the source/drain recess 48 over the transitional epitaxial layers 56a. The epitaxial source/drain layers 56b may be grown from the exposed surfaces of the epitaxial source/drain layers 56a and end surfaces 15n of the channel layers 15 exposed to the source/drain recesses 48. The epitaxial source/drain layers 56b may include one or more layers of Si, SiP, SiC and SiCP. The epitaxial source/drain layers 56b also include n-type dopants, such as phosphorus (P), arsenic (As), etc. In some embodiments, the epitaxial source/drain layers 56b may be a Si layer including phosphorus dopants. The dopant concentration in the epitaxial source/drain layers 56b is higher than that of the transitional epitaxial layers 56a.

Operations 118, 120, 122 may be repeated form inner spacers 55, backside alignment features 62, and epitaxial source/drain features 60 over the n-well 12 for P-type devices, as shown in FIGS. 11A-D.

Figure 11A:
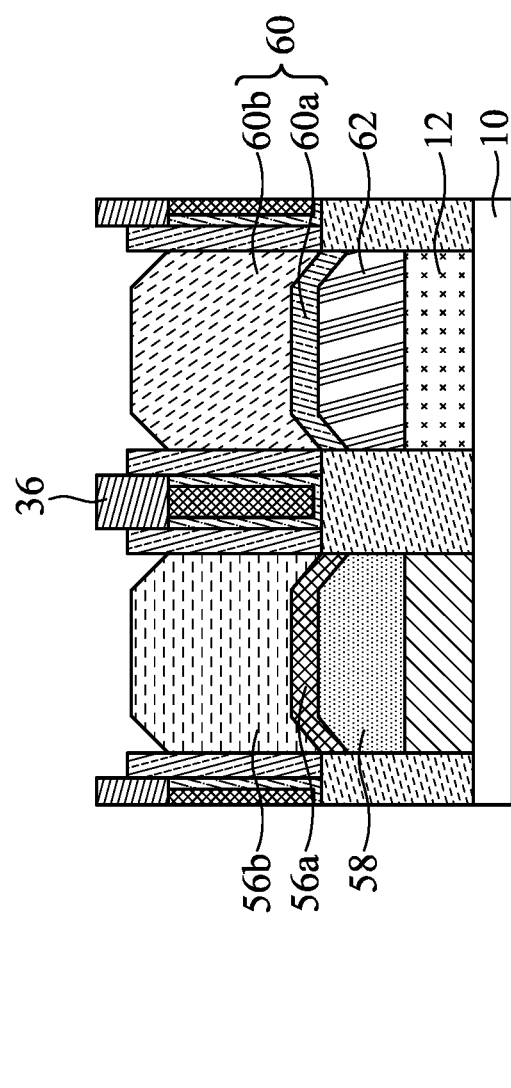
Figure 11B:
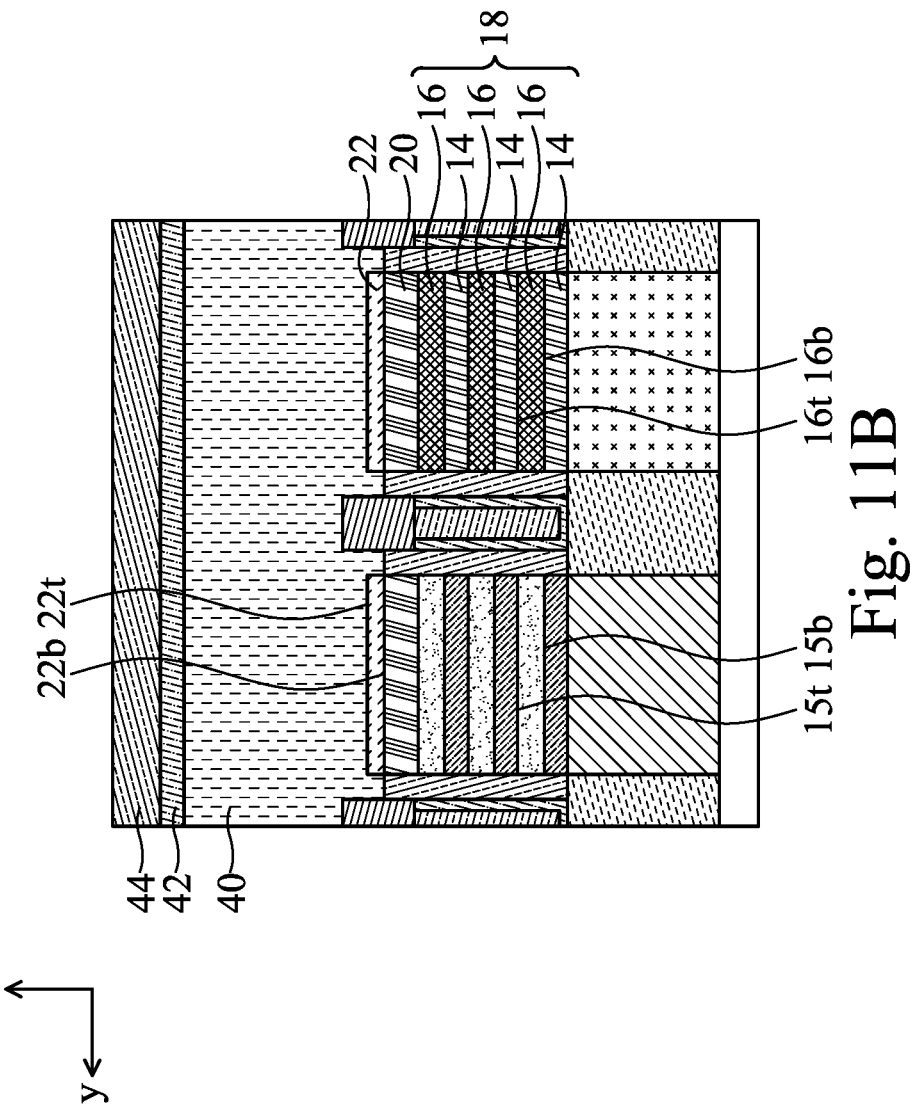
Figure 11C:
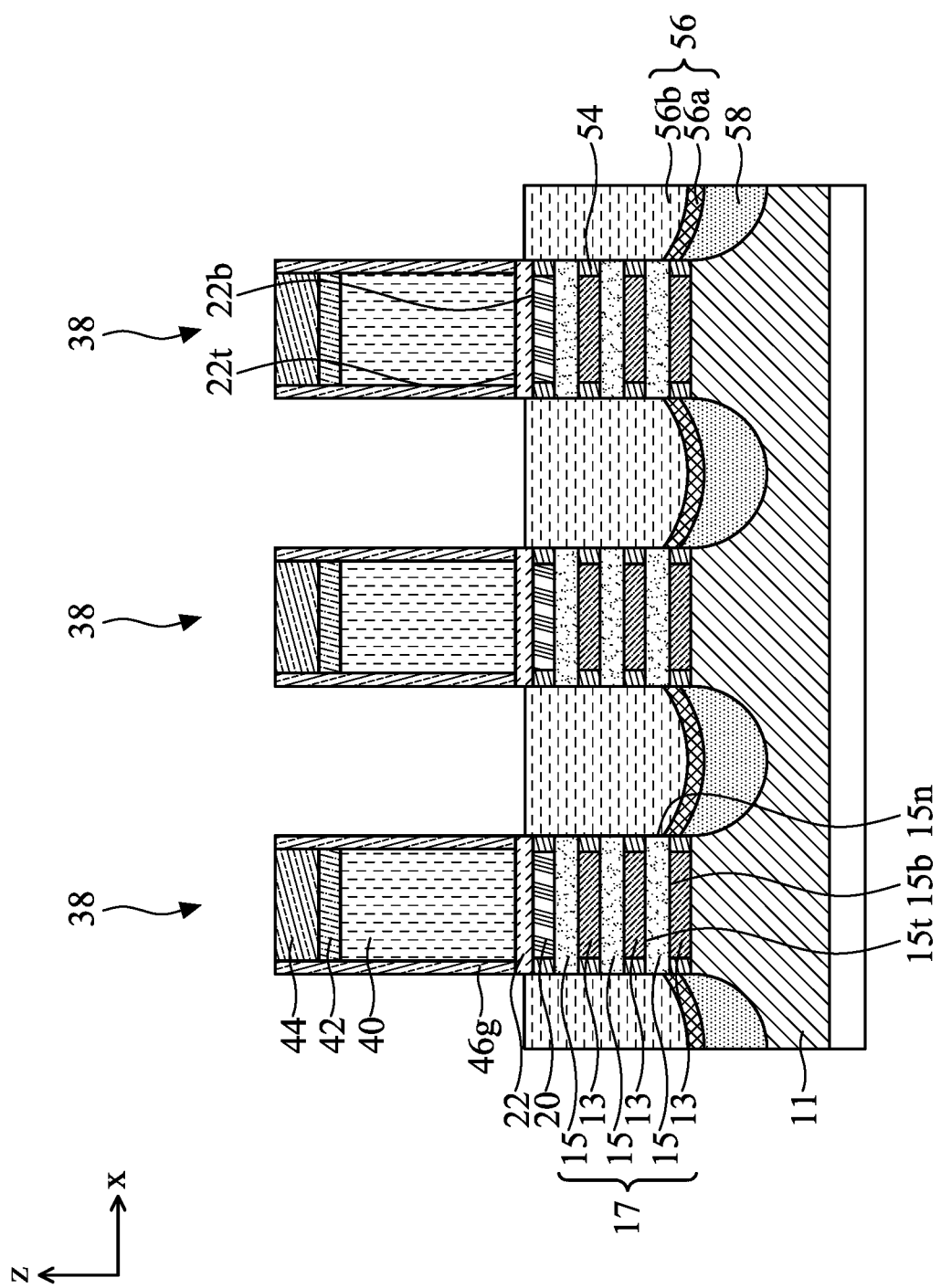
Figure 11D:
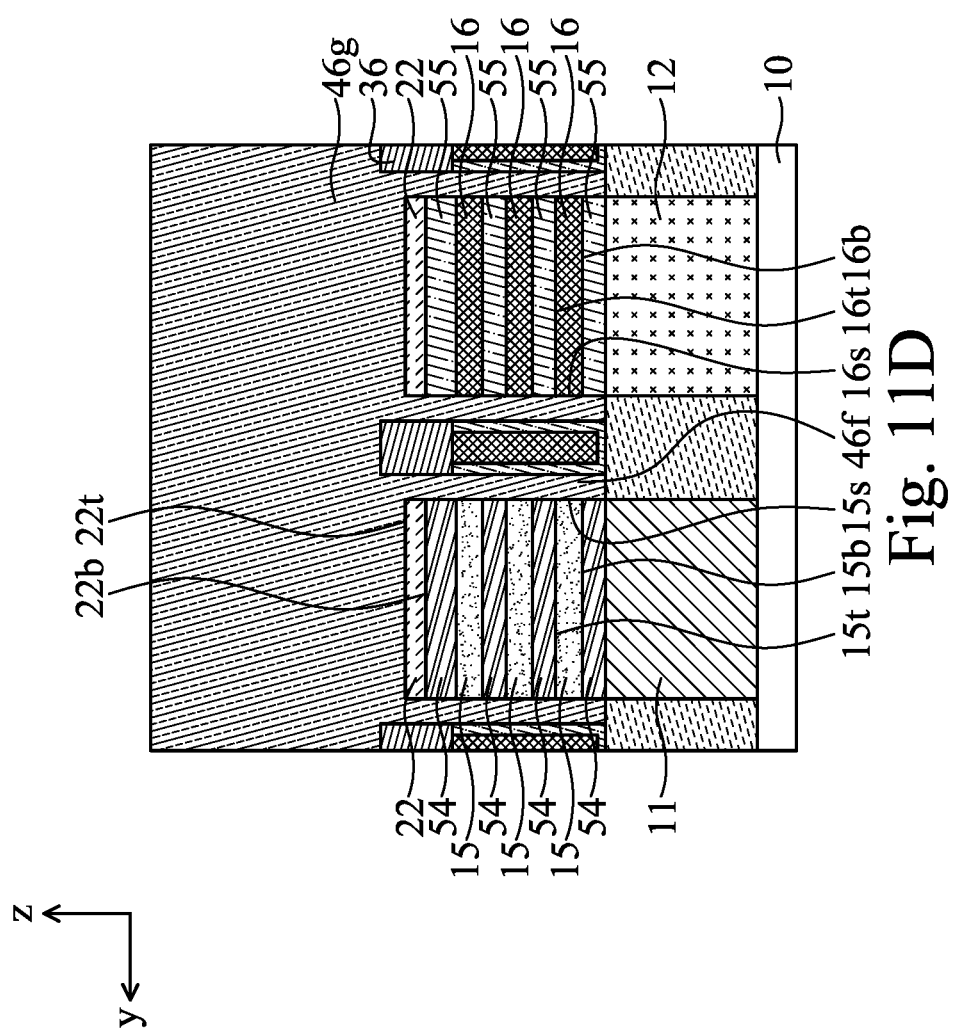

The inner spacers 55 may be similar to the inner spacers 54 described above. The backside contact alignment features 62 may be similar to the backside contact alignment features 58 described above. As shown in FIGS. 11C and 11D, because of the top spacing layer 20 is formed over the topmost second channel layer 16, end portions of every second channel layer 16 is sandwich between two inner spacers 55. Particularly, each second channel layer 16 has a top surface 16t and a bottom surface 16b. Prior to forming the inner spacers 55, the top surface 16t of the topmost second channel layer 16 is in contact with the top spacing layer 20 and the bottom surface 16b of the topmost channel layer 16 is in contact with one second spacing layer 14, while all other second channel layers 16 are in contact with a second spacing layer 14 on both the top surface 16t and the bottom surface 16b.

After formation of the inner spacers 54, end portions or portions under the gate sidewall spacers 46g of each second channel layer 16 is in contact with a corresponding inner spacer 55 on both the top surface 16t and the bottom surface 16b. As shown in FIG. 11D, end portions of portions under the gate sidewall spacers 46g of each second channel layer 16 are surrounded by spacers on all sides. Particularly, the top surface 16t and bottom surface 16b are in contact with the inner spacers 55. Side surfaces 16s connecting the top surface 16t and the bottom surface 16b are in contact with fin sidewall spacer 46f.

End portions or portions under the gate sidewall spacers 46g of the hard mask layer 22, which is formed over the topmost first/second channel layers 15/16, are in contact with the gate sidewall spacer 46g on a top surface 22t and in contact with the topmost inner spacer 55 at a bottom surface 22b. Side surfaces connecting the top surface 22t and the bottom surface 22b are in contact with fin sidewall spacer 46f.

The epitaxial feature 60 may include a transitional epitaxial layer 60a and an epitaxial source/drain layer 60b. The transitional epitaxial layer 56a may be formed by any suitable method, such as by CVD, CVD epitaxy, molecular beam epitaxy (MBE), or any suitable deposition technique. The transitional epitaxial layer 60a can serve to gradually change the lattice constant from that of the backside contact alignment feature 62 (when present) or the n-well 12 to that of the source/drain layers 60b. In some embodiments, the transitional epitaxial layer 60a may be a semiconductor material includes p-type dopants at a dopant concentration lower than a dopant concentration used in a source/drain feature. In some embodiments, the transitional epitaxial layer 60a may include one or more layers of Si, SiGe, Ge with p-type dopants, such as boron (B), for a p-type device, such as pFET. In some embodiments, the transitional epitaxial layer 60a may be SiGeB material, wherein boron is a dopant. The epitaxial source/drain layer 60b are formed over the transitional epitaxial layer 60a. The epitaxial source/drain layer 60b may include one or more layers of Si, SiGe, Ge with p-type dopants, such as boron (B), for a p-type device, such as pFET. In some embodiments, the epitaxial source/drain features 66p may be SiGeB material, wherein boron is a dopant.

It should be noted that the processing sequence of forming inner spacers and source/drain features for the n-type devices and p-type devices can be switched.

Figure 12A:
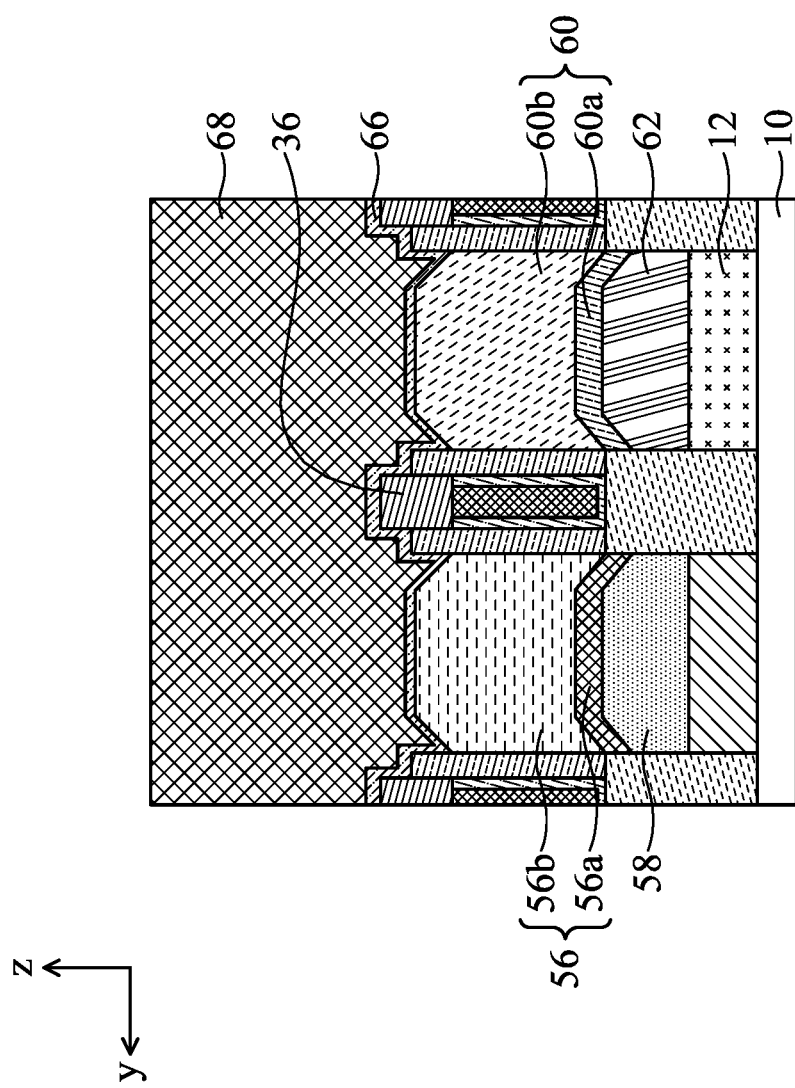
Figure 12B:
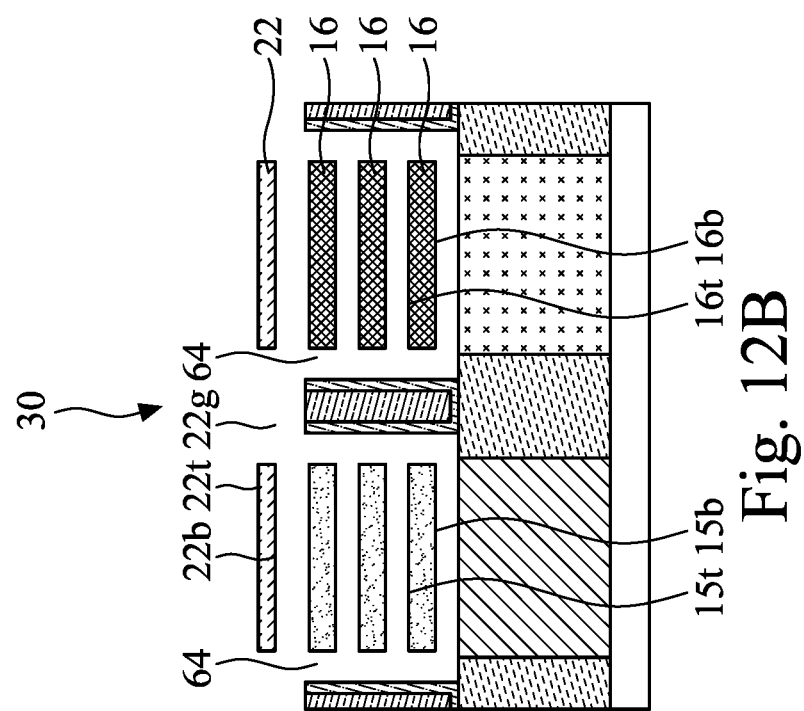
Figure 12C:
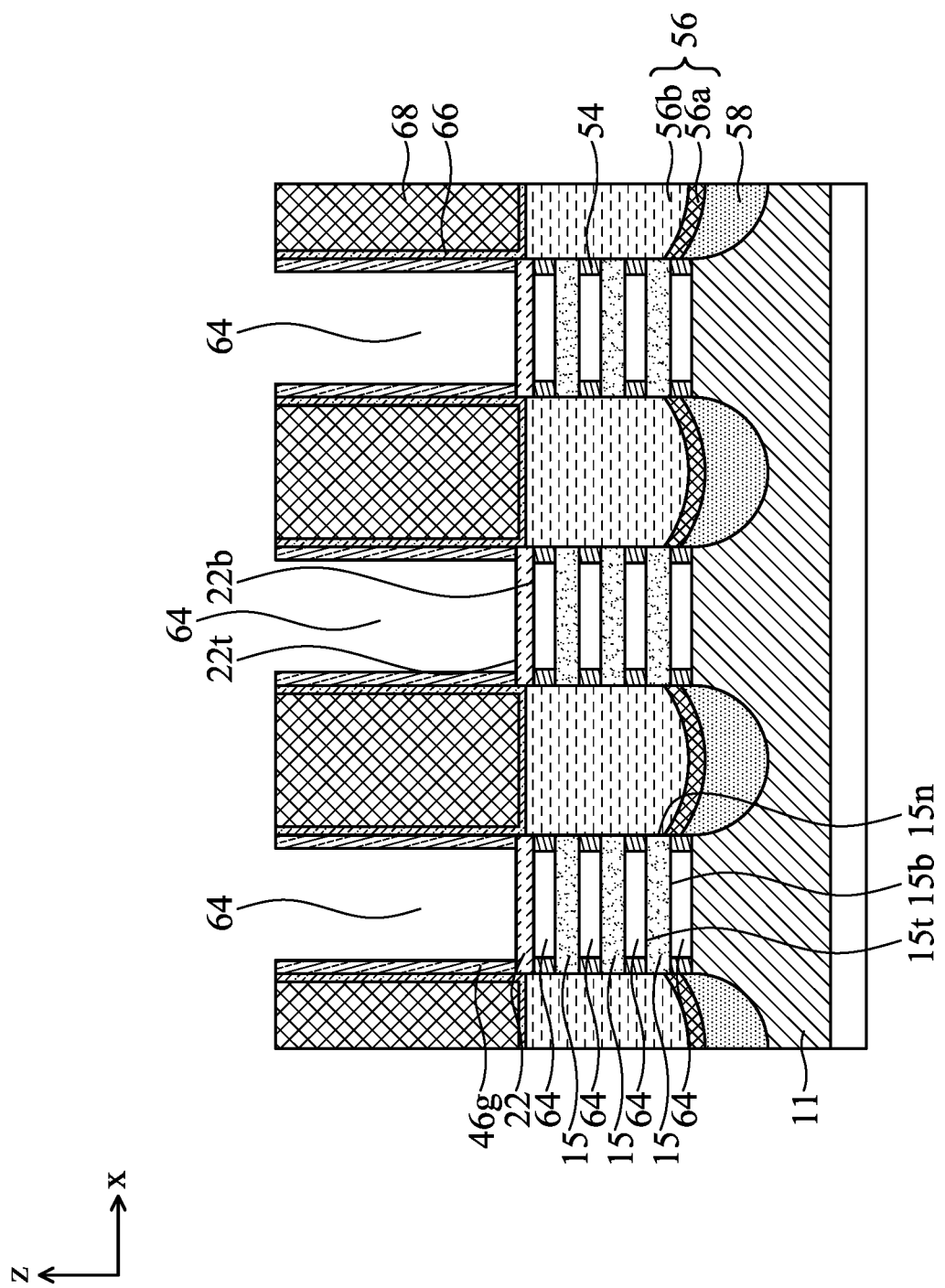

At operation 124, a contact etch stop layer (CESL) 66 is formed over the exposed surfaces as shown in FIGS. 12A-C. The CESL 66 is formed on the epitaxial source/drain layers 56b, 62b, the gate sidewall spacers 46g, and the high-k dielectric features 36. In some embodiments, the CESL 66 has a thickness in a range between about 4 nm and about 7 nm. The CESL 66 may include $Si_3N_4$, SiON, SiCN or any other suitable material, and may be formed by CVD, PVD, or ALD.

At operation 126, an interlayer dielectric (ILD) layer 68 is formed over the CESL 54 as shown in FIGS. 12A-12C. The materials for the ILD layer 68 include compounds comprising Si, O, C, and/or H, such as silicon oxide, SiCOH and SiOC. Organic materials, such as polymers, may be used for the ILD layer 68. The ILD layer 68 protects the epitaxial source/drain layers 56b, 62p during the removal of the sacrificial gate structures 38. A planarization operation, such as CMP, is performed to expose the sacrificial gate electrode layer 40 for subsequent replacement gate process sequence.

At operation 128, replacement gate structures 70 are formed as shown in FIGS. 12A-C and FIGS. 13A-C. The sacrificial gate electrode layer 40 and the sacrificial gate dielectric layer, if present, are first removed to expose the fin structures 24n, 24p and the cladding layer 28 on both sides of the fin structures 24n, 24p by a suitable etching process. The sacrificial gate electrode layer 40 can be removed using plasma dry etching and/or wet etching. When the sacrificial gate electrode layer 40 is polysilicon, a wet etchant such as a Tetramethylammonium hydroxide (TMAH) solution can be used to selectively remove the sacrificial gate electrode layer 40 without removing the dielectric materials on the gate sidewall spacers 46g, the ILD layer 68, the CESL layer 54, the high-k dielectric features 36, and the hard mask layer 22.

After removal of the sacrificial gate electrode layer 40, a suitable etch process is then performed to selective remove the cladding layers 28. The cladding layer 28 can be removed using plasma dry etching and/or wet etching. After removal of the cladding layers 28, the first spacing layers 13 and the second spacing layers 14 are exposed and subsequently removed resulting in gate cavities 64. In some embodiments, the first spacing layers 13 and the second spacing layers 14 can be removed during the same etch process for removal of the cladding layers 28. In other embodiments, the first spacing layers 13 and the second spacing layers 14 can be selectively removed using a wet etchant such as, but not limited to, ammonium hydroxide ($NH_4OH$), tetramethylammonium hydroxide (TMAH), ethylenediamine pyrocatechol (EDP), or potassium hydroxide (KOH) solution.

Figure 13A:
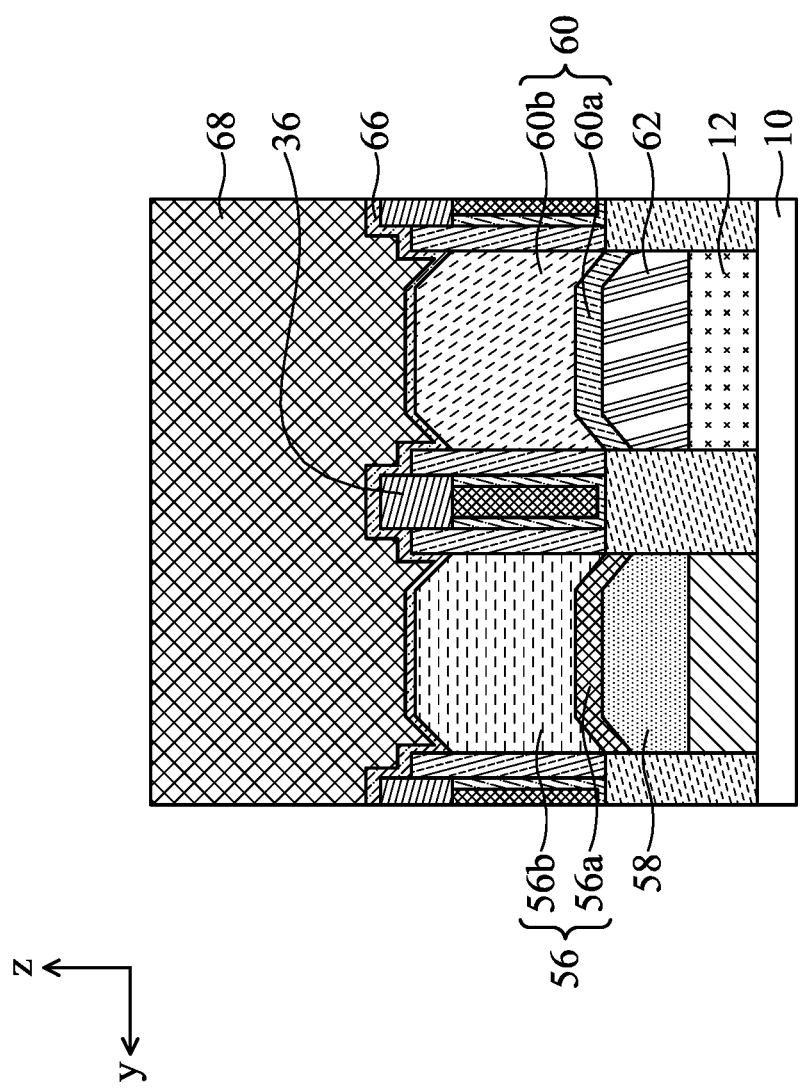
Figure 13B:
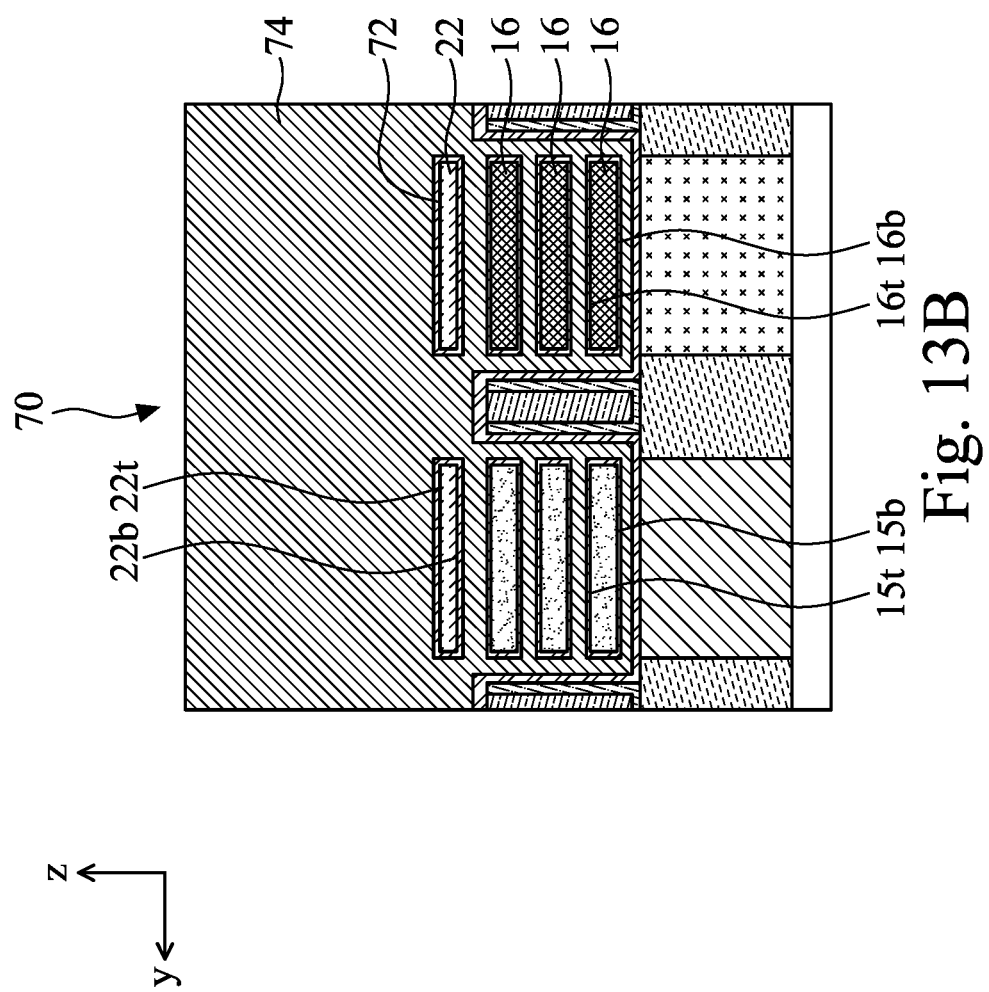
Figure 13C:
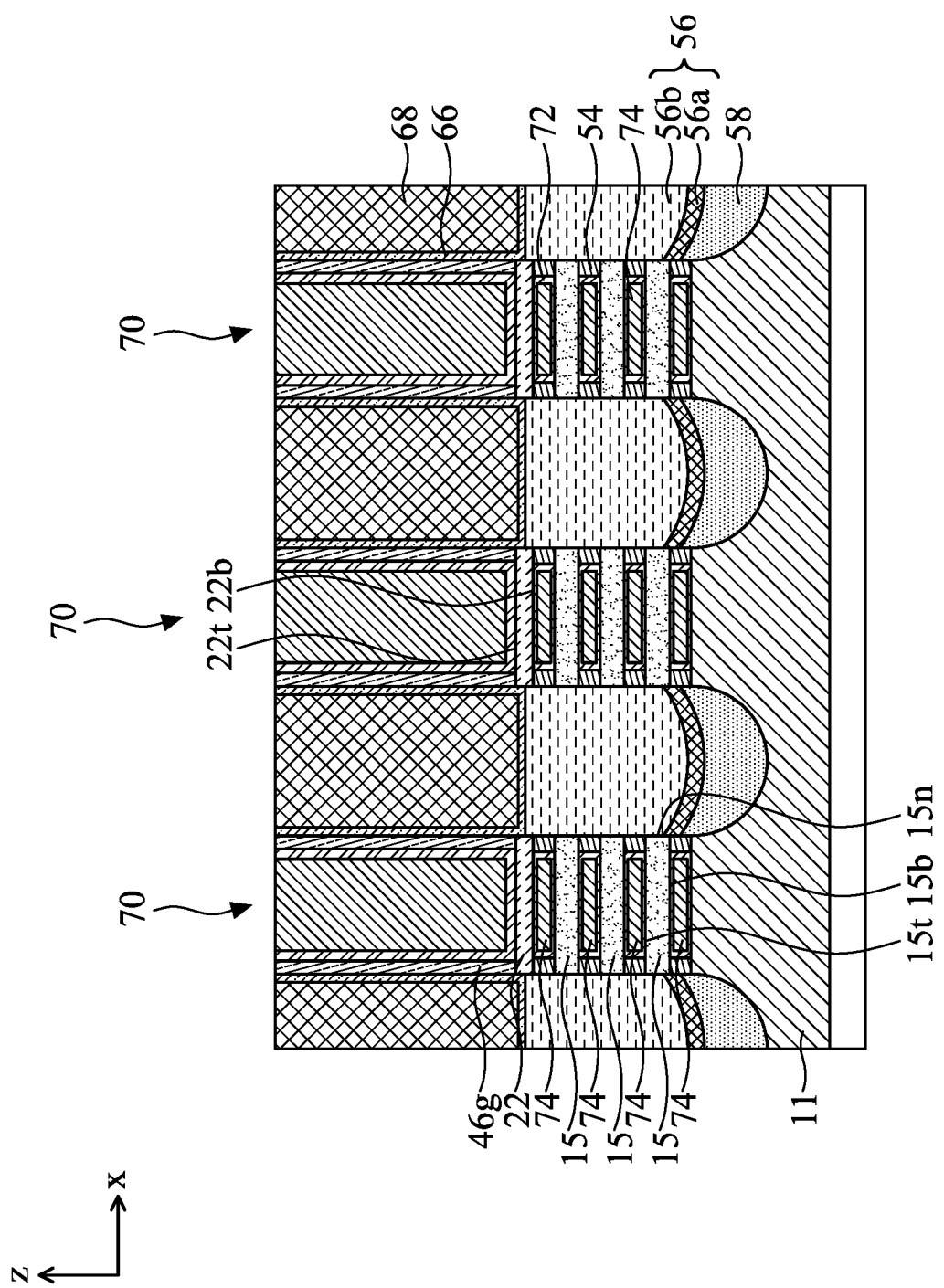

The gate cavities 64 are defined between surfaces of the hybrid fins 30 and the fin sidewall spacers 46f, and between surfaces of the gate sidewall spacers 46g and the inner spacers 54/55, as shown in FIGS. 12B and 13C. Each gate cavity 64 surrounds a hard mask layer 22, and two or more channel layers 15 or 16 vertically stacked below the nanosheet of hard mask layer 22. In some embodiments, the high-k dielectric features 36 may be removed, as shown in FIG. 12B, to expand a gap 22g between the volume above the nanosheet of hard mask layer 22 and the volume below the nanosheet of hard mask layer 22 within the cavities 64.

The replacement gate structure 70 includes a gate dielectric layer 72 and a gate electrode layer 74. The gate dielectric layer 72 is formed on exposed surfaces in the gate cavities 64. The gate dielectric layer 72 is formed on exposed surfaces of the nanosheet of hard mask layer 22, channel layers 15/16, the inner spacers 54/55, the fin sidewall spacers 46f, the gate sidewall spacers 46g, and the hybrid fins 30.

In some embodiments, the gate dielectric layer 72 for N-type devices and P-type device may have different composition and dimensions and formed in separate steps. For P-type devices, the gate dielectric layer 72 may include one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. For N-type devices, the gate dielectric layer 72 may include one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof.

The gate dielectric layer 72 may be formed by CVD, ALD or any suitable method. In one embodiment, the gate dielectric layer 72 is formed using a highly conformal deposition process such as ALD in order to ensure a uniform thickness around each of the channel layers 15, 16. In some embodiments, the thickness of the gate dielectric layer 72 is in a range between about 1 nm and about 6 nm. In some embodiments, an interfacial layer (not shown) is formed between the channel layers 15, 16 and the gate dielectric layer 72.

The gate electrode layer 74 is formed on the gate dielectric layer 72 to fill the gate cavities 64, as shown in FIGS. 13A-13C. The gate electrode layer 74 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. In some embodiments, the gate electrode layer 74 may be formed by CVD, ALD, electro-plating, or other suitable method.

After the formation of the gate electrode layer 74, a planarization process, such as a CMP process, is performed to remove excess deposition of the gate electrode material and expose the top surface of the ILD layer 68. As shown in FIGS. 13B and 13C, the replacement gate structures 70 are formed around the nanosheet of hard mask layer 22 and channel layers 15/16.

Figure 14A:
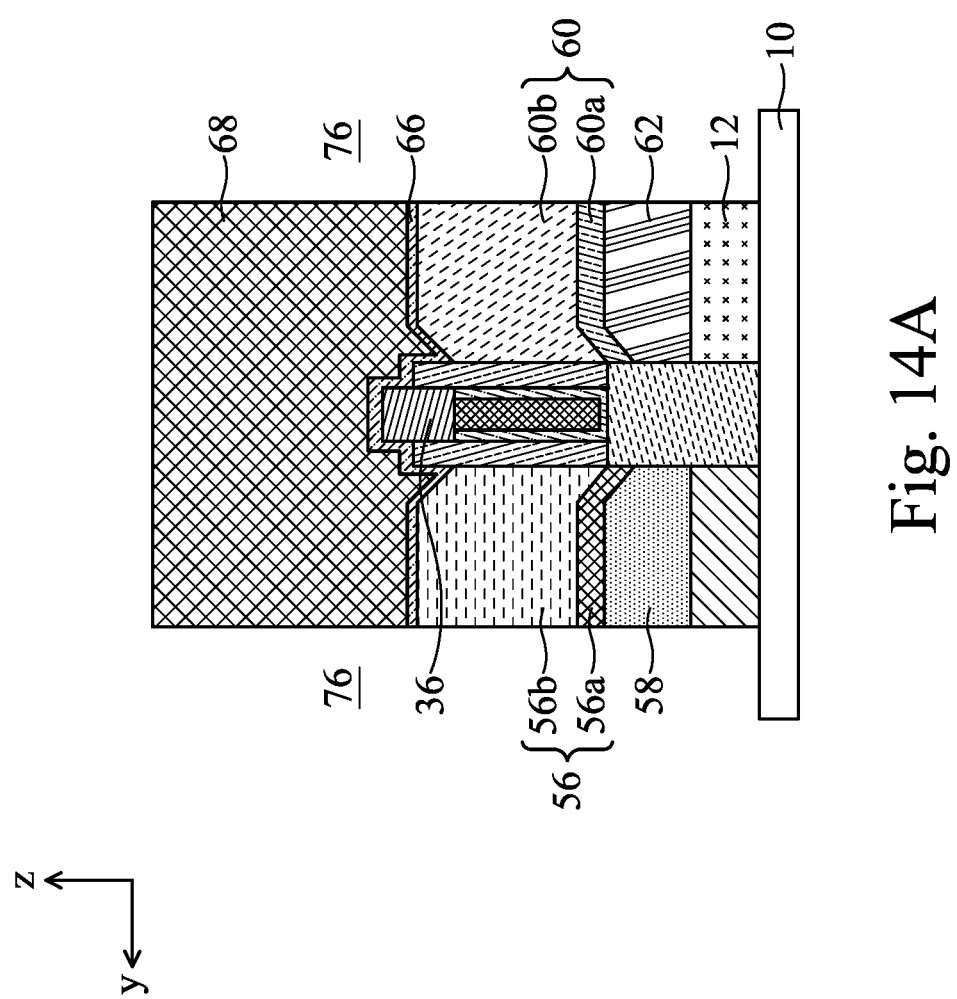
Figure 14B:
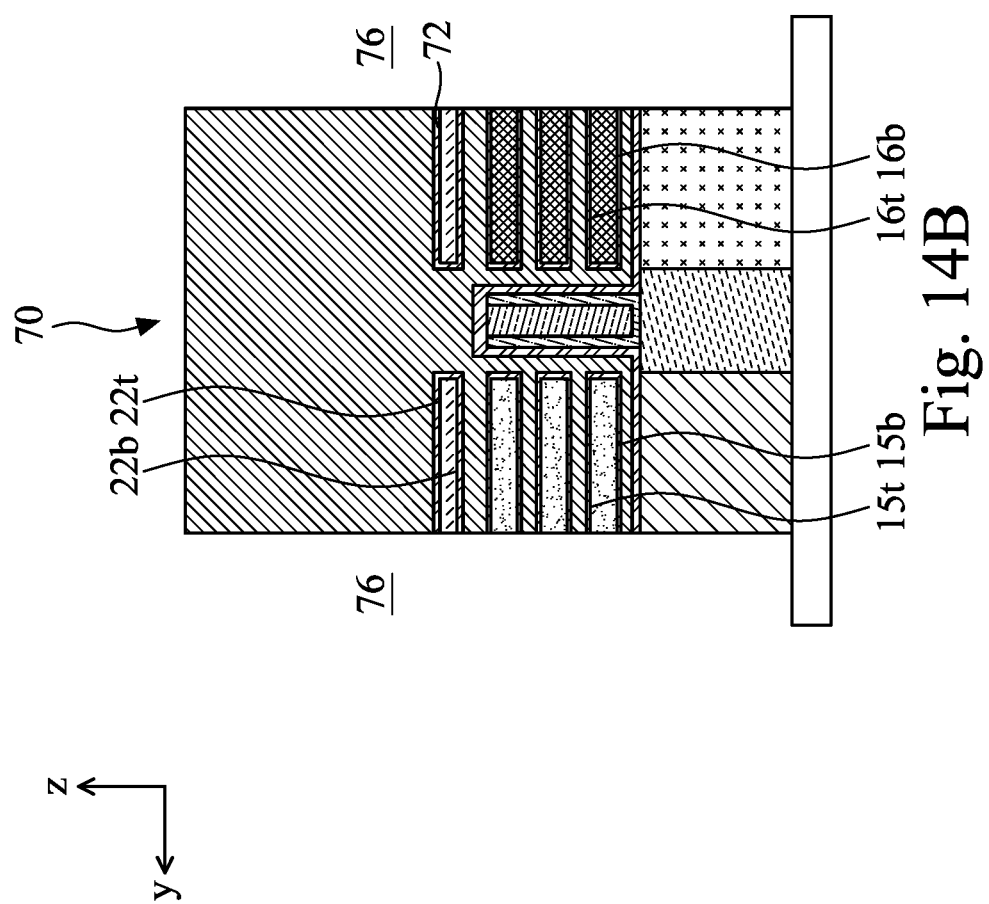

At operation 130, boundary trenches 76 are formed along a direction substantially perpendicular to the replacement gate structures 70 or parallel to the fin structures 24n, 24p, as shown in FIGS. 14A-14D. In some embodiments, two boundary trenches 76 are formed on opposing sides of two neighboring fin structures, such as the fin structures 24n, 24p. Each one of the boundary trenches 76 may intersect and cut one or more replacement structures 70. A portion of each of the fin structure 24n, 24p overlaps with the corresponding boundary trenches 76 and is removed when the boundary trenches 76 are formed. The fin structures 24n, 24p between the boundary trenches 76 form fork shaped nanosheet structures, as shown in FIG. 14B. Even though the fork shaped nanosheet structures in FIG. 14B includes a fin structure 24n for N-type devices and a fin structure 24p for P-type device, fork shaped nanosheet structures may include two fin structures for the same type of devices.

In some embodiments, the boundary trenches 76 are formed through the replacement gate structures 70 or through all layers of the channel layers 15, 16 into the p-well 11/n-well 12. To form the boundary trenches 76, one or more etch processes are performed to etch through the ILD layer 68, the CESL 66, the gate sidewall spacers 46g, the gate electrode layer 74, the gate dielectric layer 72, the inner spacers 54, 55, the nanosheet of hard mask layer 22, the channel layers 15,16, and the epitaxial source/drain features 56, 60.

Figure 14C:
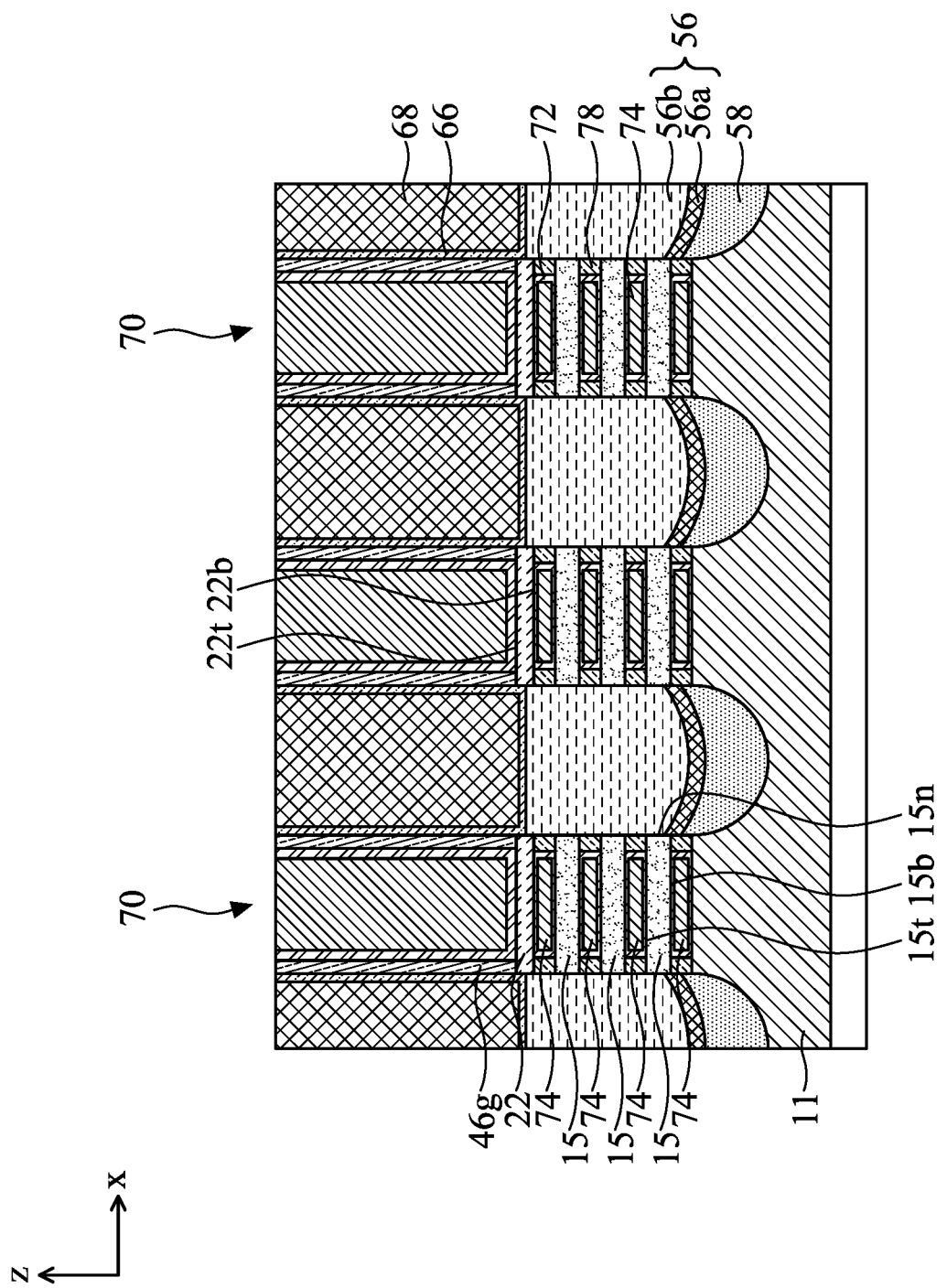
Figure 14D:
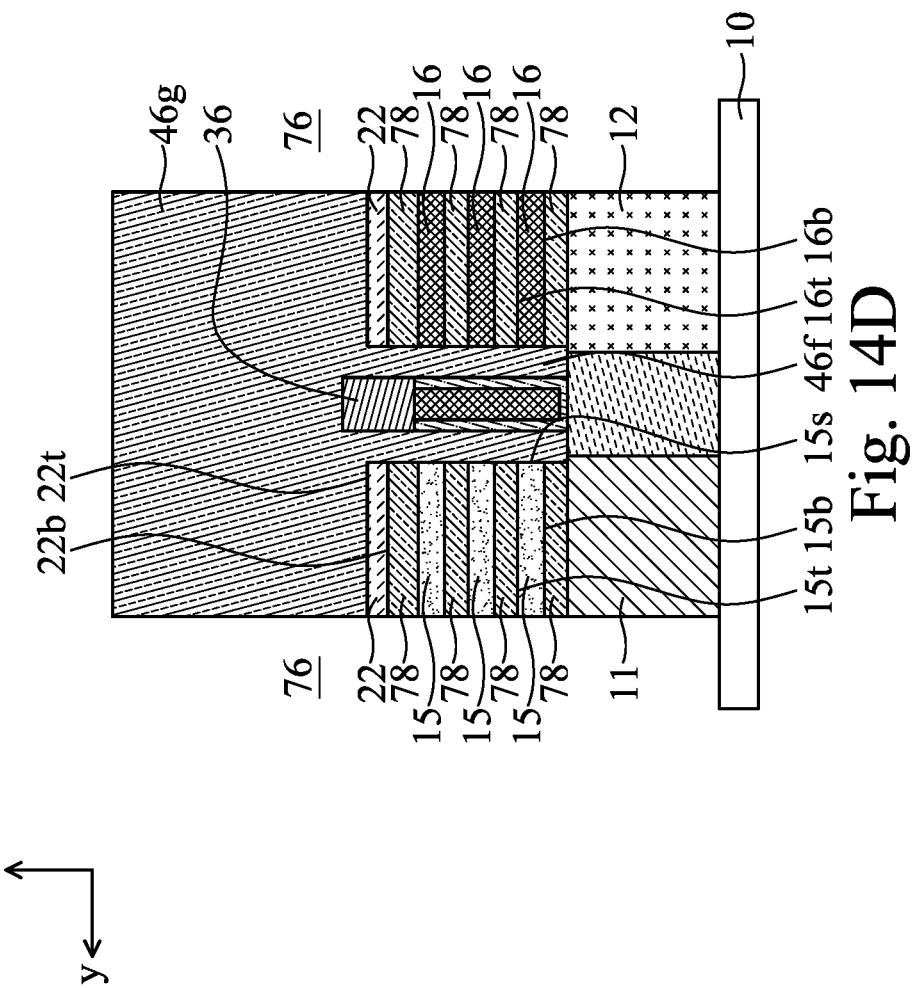

At operation 132, inner air spacers 78 are formed by removing the inner spacers 54, 55 as shown in FIGS. 14C-14D. As shown in FIG. 14D, the inner spacers 54, 55 are exposed to the boundary trenches 76 because a portion of the fin structure 24n, 24p overlaps with the corresponding boundary trenches 76. The inner air spacers 78 are formed by selective etching the inner spacers 54, 55 through the boundary trenches 76. In some embodiments, the inner spacers 54, 55 may be removed by a suitable etching process.

As shown in FIGS. 14C-14D, end portions or portions under the gate sidewall spacers 46g of each channel layers 15, 16 is in contact with an air inner spacer 78 on both the top surface 15t and the bottom surface 15b. End portions or portions under the gate sidewall spacers 46g of the nanosheet of hard mask layer 22 are in contact with the gate sidewall spacer 46g on the top surface 22t and in contact with the air inner spacer 78 at the bottom surface 22b. By replacing the inner spacers 54, 55 with air inner spacers 78, the insolation between the source/drain features 56, 60 and the metal gate structure to be formed is further improved. It should be noted that the operation 132 may be omitted, semiconductor devices with the inner spacers 54,55 instead of the air inner spacers 78 also within the scope of the present disclosure.

In operation 134, the boundary trenches 76 are filled with a dielectric material to form cell boundary structures 79, as shown in FIGS. 15A-15D. The cell boundary structures 79 may be formed one or more dielectric layers. In some embodiments, the cell boundary structures 79 are formed by silicon nitride, silicon oxide, or a combination.

At operation 136, a metal gate etching back (MGEB) process is performed to form a self-aligned contact (SAC) layer 84, as shown in FIGS. 15A-15D. One or more etching process is performed to remove portions of the gate dielectric layer 72 and the gate electrode layer 74 to form trenches in the region above the remaining gate electrode layer 74. The MGEB process may be a plasma etching process employing one or more etchants such as chlorine-containing gas, a bromine-containing gas, and/or a fluorine-containing gas. The etching process allows the gate dielectric layer 72 and the gate electrode layer 74 to be selectively etched from the ILD layer 68 and the CESL 68.

Figure 15A:
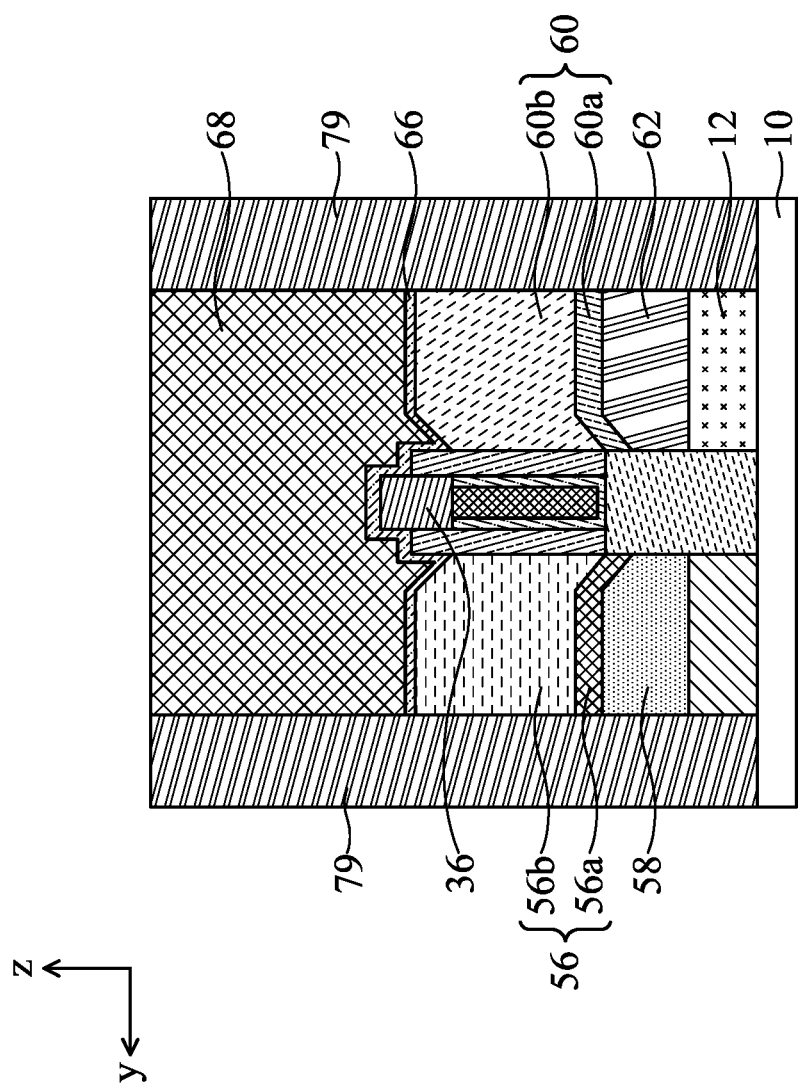
Figure 15B:
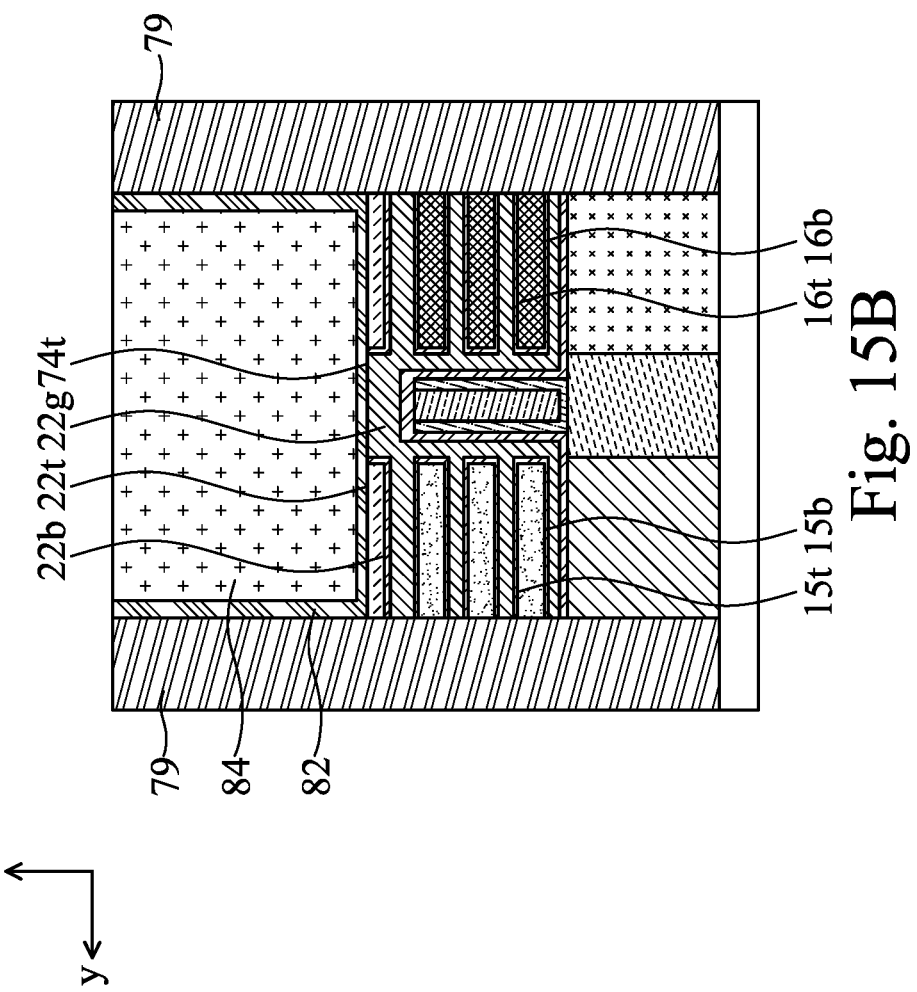
Figure 15C:
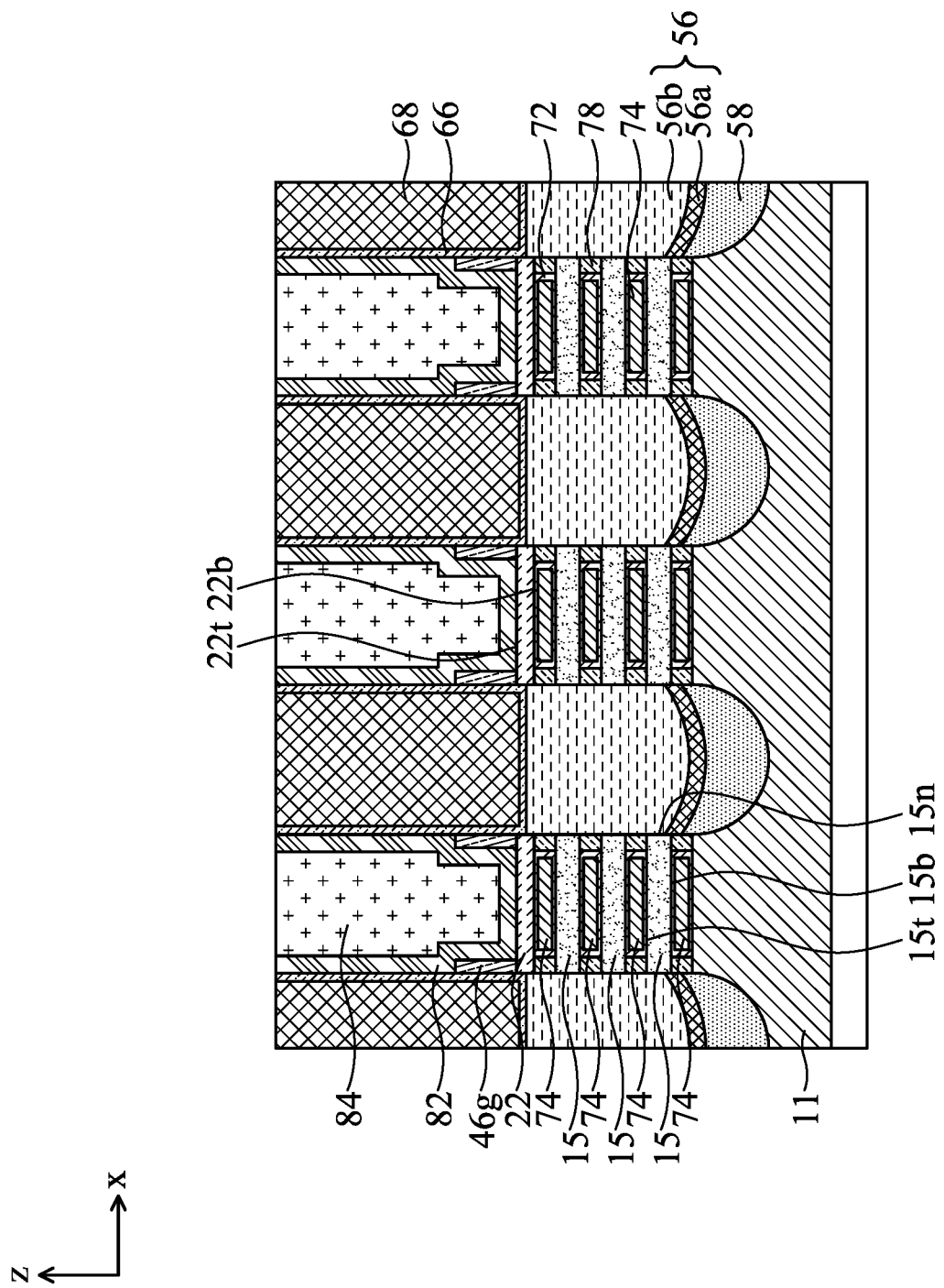
Figure 15D:
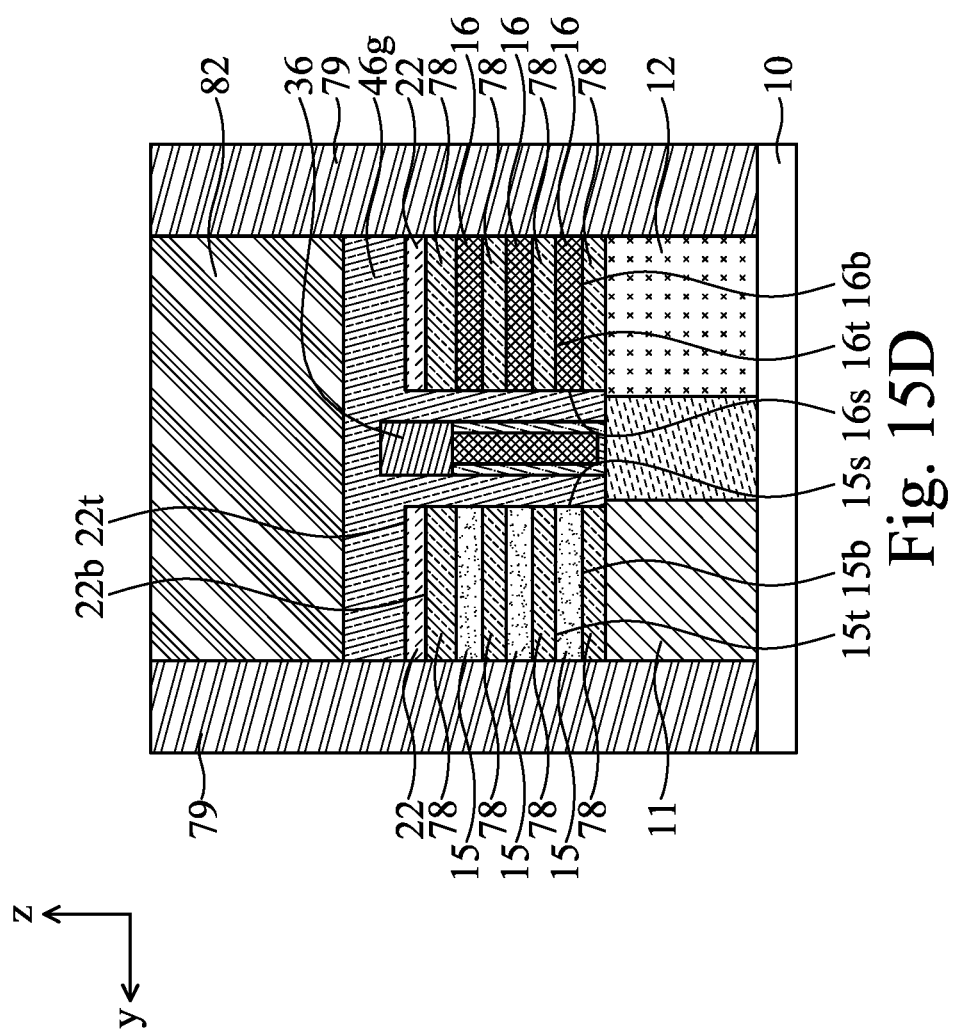

In the MGEB process, a top surface 74t of the gate electrode layer 74 is etched to a level lower than a top surface of the high-k dielectric features 36 and higher than the topmost channel layer 15, 16 so that the high-k dielectric features 36 electrically isolate sections of the gate electrode layer 74. According to embodiments of the present disclosure, the nanosheet of hard mask layer 22 is used as an etch stop in the MGEB process to control the height of the gate electrode layer 74. The nanosheet of hard mask layer 22 covers the gate electrode layer 74 protecting the gate electrode layer 74 underneath. As shown in FIGS. 15B and 15C, after the MGEB process, the top surface 74t of the gate electrode layer 74, which is in the gap 22g, is substantially co-planar with the top surface 22t of the nanosheet of hard mask layer 22.

In some embodiments, the gate sidewall spacers 46g are also etched back to a level be lower than the CESL 66 and higher than the gate electrode layer 74. By etching the gate sidewall spacers 46g below the CESL 66, the gate sidewall spacers 46g can be covered and protected by the subsequently formed SAC layer while forming source/drain metal contacts. By keeping the gate sidewall spacers 46g at a level higher than the gate electrode layer 74 and gate dielectric layer 72, the gate electrode layer 74 remain protected by the gate sidewall spacers 46g. The gate sidewall spacers 46g may be etched back during the MGEB process or in a separate etching process.

In some embodiments, a metal gate liner 82 may be first deposited on exposed surfaces in the trenches above the gate electrode layer 74 prior to depositing the SAC layer 84. The metal gate liner 82 and the SAC layer 84 may be formed by a suitable deposition process, such as CVD, PVD, or ALD. The metal gate liner 82 may function as a diffusion barrier for the gate electrode layer 74. The metal gate liner 82 may be a dielectric layer including but not limited to SiO, SiN, SiC, SiCN, SiOC, SiON, SiOCN, ZrO, ZrN, or a combination thereof. The SAC layer 84 may be any dielectric layer that can be used as an etch stop layer during subsequent trench and via patterning for metal contacts. In some embodiments, the SAC layer 84 may a high-k dielectric layer. The SAC layer 84 may a dielectric layer including but not limited to SiO, HfSi, SiOC, AlO, ZrSi, AlON, ZrO, HfO, TiO, ZrAlO, ZnO, TaO, LaO, YO, TaCN, SiN, SiOCN, Si, SiOCN, ZrN, SiCN, or any combinations thereof.

After filling the trenches with the SAC layer 84, a planarization process, such as a CMP process, is performed to remove excess deposition of the SAC layer 84 and metal gate liner 82 to expose the top surface of the ILD layer 68.

Figure 16A:
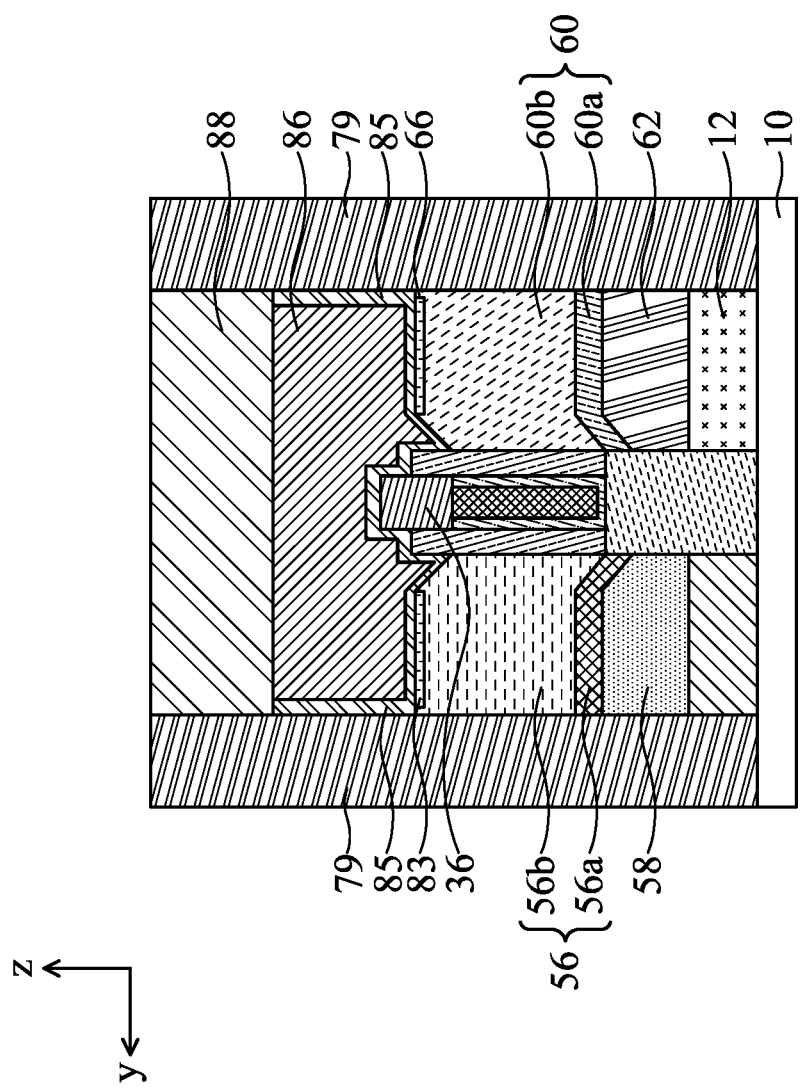
Figure 16B:
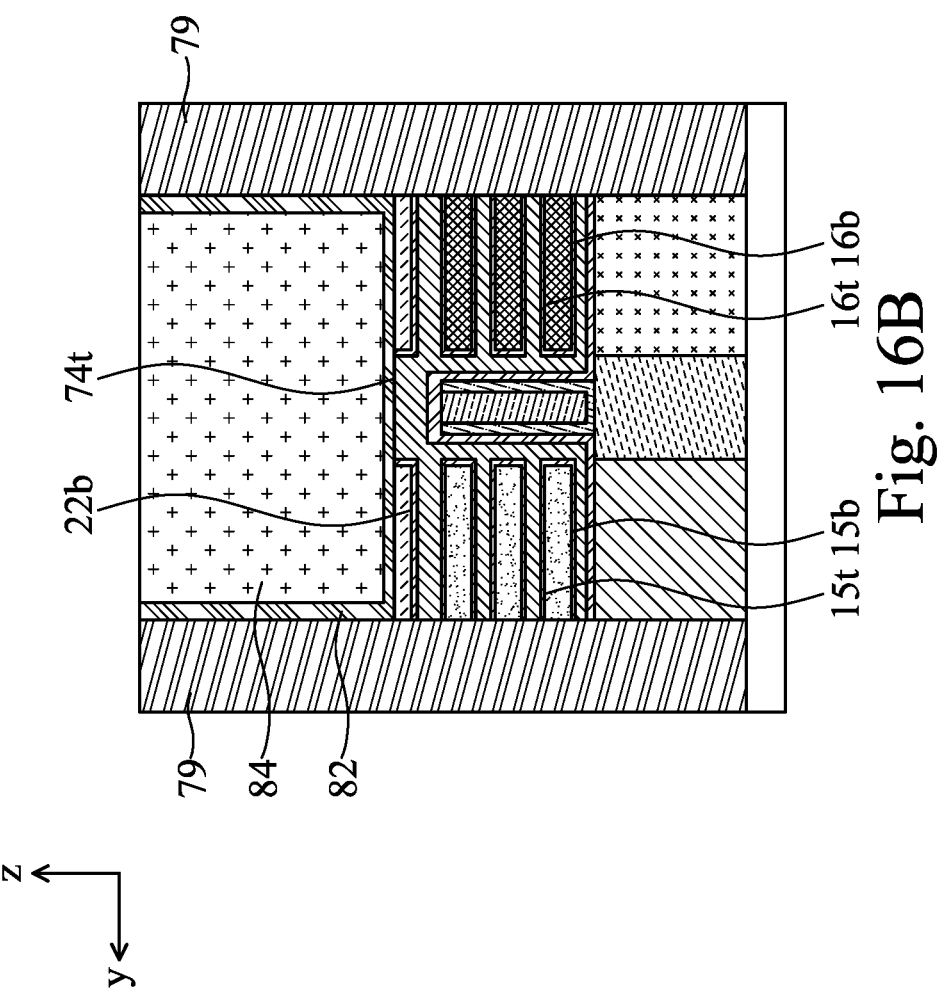
Figure 16C:
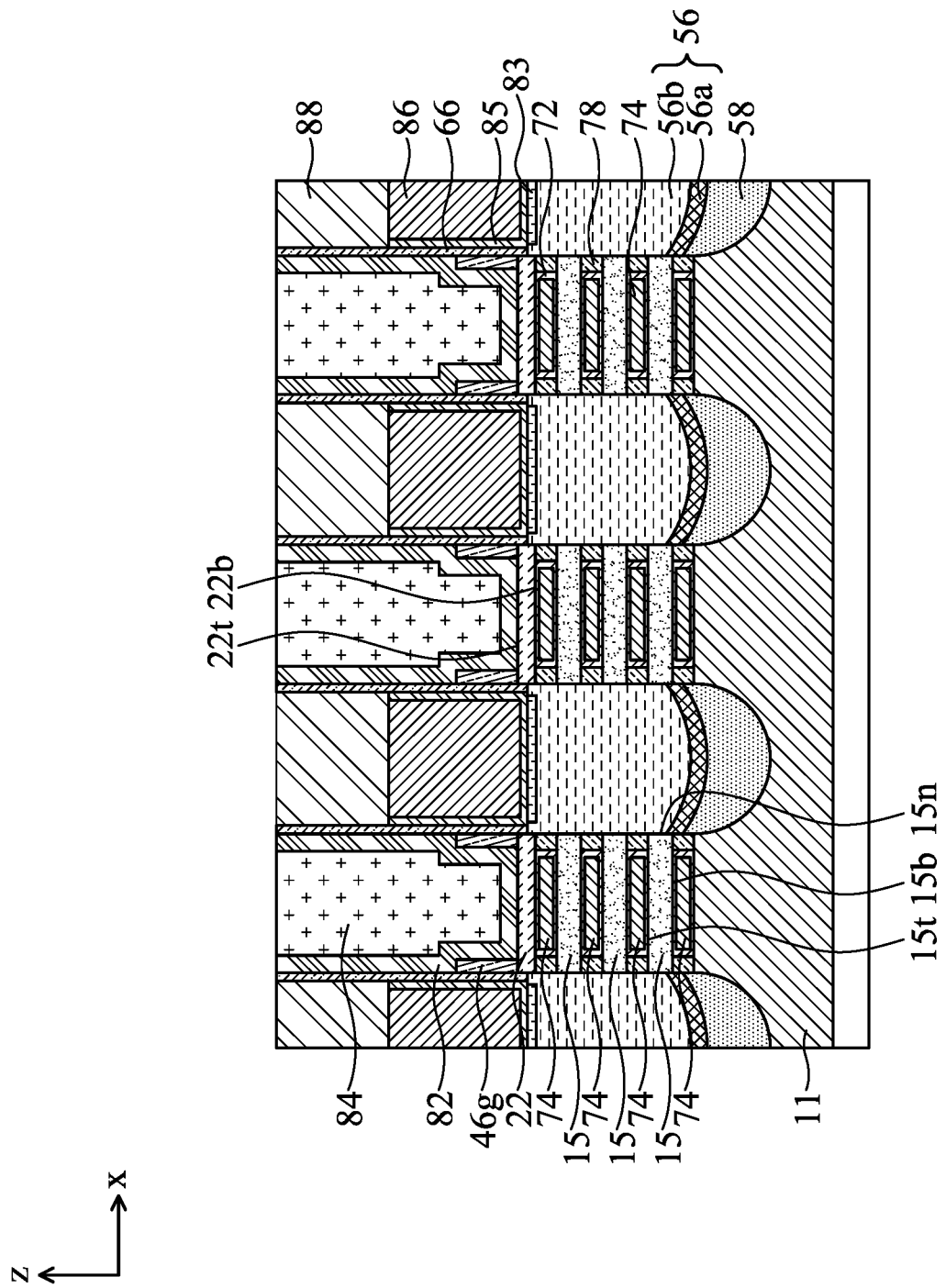

At operation 138, source/drain metal contacts 86 are formed as shown in FIGS. 16A-16C. Contact holes may be formed through the ILD layer 68 and the CESL 66 to expose a top surface of the source/drain features 56, 60. In some embodiments, the contact holes may to form source/drain metal contacts 86 thereon to achieve structure balance.

A silicide layer 83 is selectively formed over an exposed surface of the source/drain features 56, 60 exposed by the contact holes. In some embodiments, the silicide layer 83 includes one or more of WSi, CoSi, NiSi, TiSi, MoSi, and TaSi.

After formation of the silicide layer 83, a barrier layer 85 is formed over surfaces of the contact holes prior to forming the source/drain metal contacts 86. In some embodiments, the barrier layer 85 may be formed from Ti, Ta, TiN, TaN, W, Co, Ru, or the like. The source/drain metal contacts 86 may be formed from a conductive material. In some embodiments, the conductive material for the side source/drain metal contacts 86 includes but limited to W, Co, Ru, Ti, Ni, Cu, Au, Ag, Pt, Pd, Ir, Os, Rh, Al, Mo, or the like.

The source/drain metal contacts 86 are then etched back and isolation features 88 are formed in the source/drain metal contacts 86. The isolation features 88 may include a low-k dielectric material. The isolation features 88 may be removed in subsequent process and serve as self-alignment feature for contact holes to connect with the source/drain metal contacts 86. In some embodiments, the isolation features 88 may include but not limited to SiO, SiN, SiC, SiCN, SiOC, SiON, SiCN, SiOCN, ZrO, ZrN, or a combination thereof. The isolation features 88 may be formed may be formed by a suitable deposition process, such as CVD, PVD, plating, ALD, or other suitable technique.

Figure 17A:
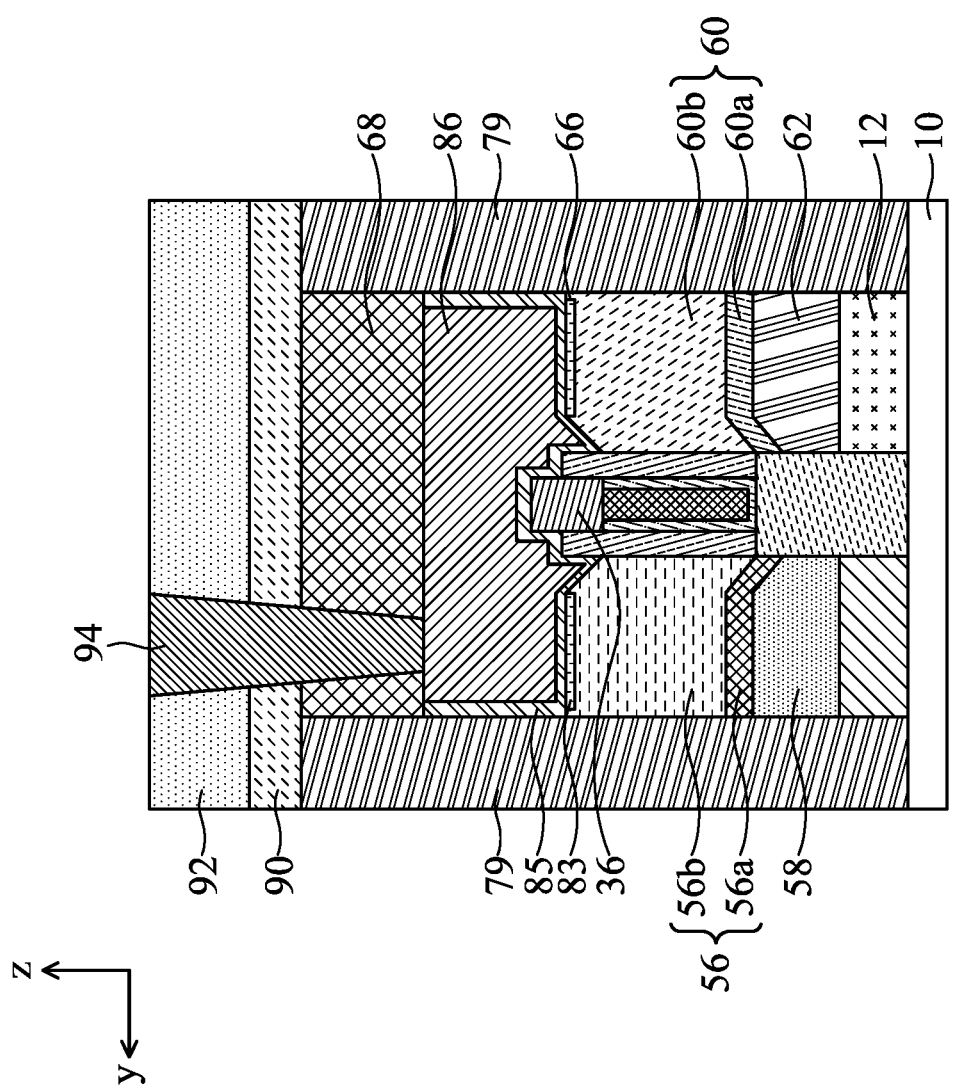
Figure 17C:
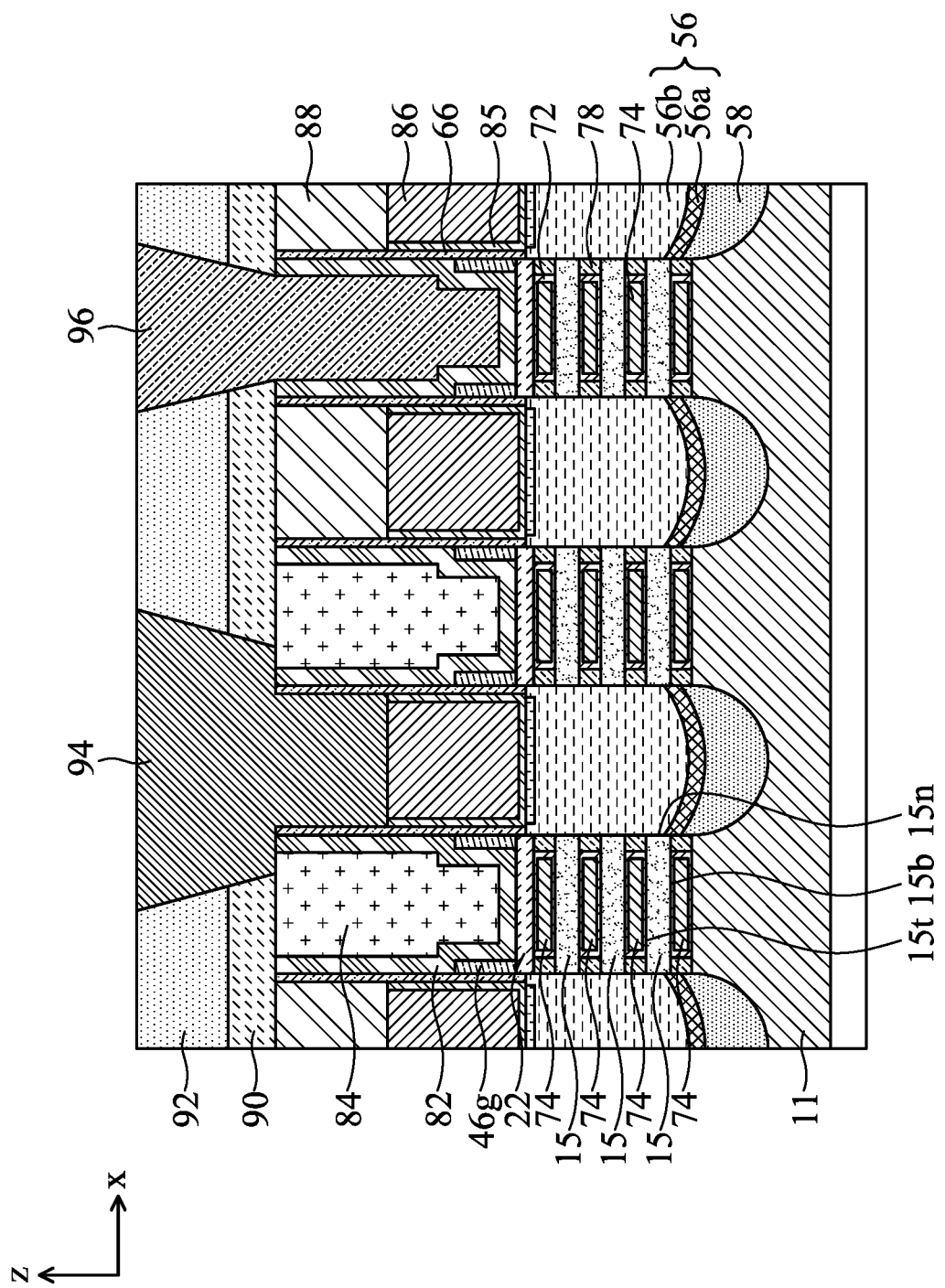

At operation 140, interconnect structure is formed as shown in FIGS. 17A-17C. The interconnect structure includes dielectric layers having conductive features embedded herein to connect the source/drain features 56, 60 and the gate electrode layer 74 to power supplies and signal lines. The interconnect structure may start with a metal CESL layer 90 and second ILD layer 92 are formed over the isolation features 88 and the SAC layer 84. Conductive features 94 and gate contact 96 are subsequently formed through the metal CESL layer 90 and second ILD layer 92.

Various embodiments or examples described herein offer multiple advantages over the state-of-art technology. By using a top spacing layer over the topmost nanosheet channels, embodiments of the present disclosure provide inner spacers around end portions of all channel layers in a multi-channel device, therefore, reducing cell capacitance and improving device performance. By using a nanosheet of hard mask over gate regions of the multi-channel device, embodiments of the present disclosure provide an improved method for controlling the height of the gate electrode during a metal gate etching back process.

It will be understood that not all advantages have been necessarily discussed herein, no particular advantage is required for all embodiments or examples, and other embodiments or examples may offer different advantages.

Some embodiments of the present provide a semiconductor device. The semiconductor device includes a nanosheet stack comprising two or more channel layers and a hard mask layer disposed over the two or more channel layers, wherein the hard mask layer has a first surface facing the two or more channel layers, and a second surface opposing the first surface, a gate dielectric layer formed around the two or more channel layers and on the first surface of the hard mask layer, and a sidewall spacer in contact with the second surface of the hard mask layer.

Some embodiments of the present disclosure provide a semiconductor device. The semiconductor device includes a first source/drain feature, and two or more first channel layers in contact with the first source/drain feature, wherein each of the two or more first channel layers includes a first surface, a second surface opposing the first surface, and an end surface connecting the first surface and second surface, wherein the first surface and second surfaces are exposed to air gaps at portions adjacent the end surface.

Some embodiments of the present disclosure provide a method for forming a semiconductor device. The method includes forming fin structures including two or more channel layers and a hard mask layer over the two or more channel layers with spacing layers formed between adjacent channel layers and the hard mask layer, forming a sacrificial gate structure over the fin structures and sidewall spacers on the sacrificial gate structure, recess etching the fin structures, removing a portion of the spacing layers to form inner spacers between the of channel layers and the hard mask layer, forming source/drain features, removing the sacrificial gate structure, and forming a replacement gate structure comprising depositing a gate dielectric layer on the two or more channel layers and the hard mask layer, and depositing a gate electrode layer over the gate dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor device, comprising:
   a nanosheet stack comprising:
      two or more channel layers; and
      a hard mask layer disposed over the two or more channel layers, wherein the hard mask layer has a first surface facing the two or more channel layers, and a second surface opposing the first surface;
   a gate dielectric layer formed around the two or more channel layers and on the first surface of the hard mask layer;
   a sidewall spacer in contact with the second surface of the hard mask layer;
   an inner spacer disposed between the first surface of the hard mask layer and the two or more channel layers; and
   a boundary feature in contact with the inner spacer, the two or more channel layers, and the hard mask layer, wherein the hard mask layer has a third surface connecting the first and second surfaces, and the boundary feature is in contact with the third surface of the hard mask layer.

2. The semiconductor device of claim 1, further comprising:
   a gate electrode layer disposed in spacings in the nanosheet stack on the gate dielectric layer, wherein a first surface of the gate electrode layer coplanar with the second surface of the hard mask layer.

3. The semiconductor device of claim 2, further comprising:
   a metal gate liner formed on the second surface of the hard mask layer and the first surface of the gate electrode; and
   a self-alignment contact (SAC) layer formed on the metal gate liner.

4. The semiconductor device of claim 3, further comprising:
   a conductive feature formed in the self-alignment contact (SAC) layer, wherein the conductive feature is in contact with the gate electrode.

5. The semiconductor device of claim 1, wherein the inner spacer is an air gap.

6. The semiconductor device of claim 1, wherein hard mask layer comprises silicon oxide, silicon nitride, silicon oxynitride, or a combination thereof.

7. The semiconductor device of claim 1, wherein the sidewall spacer comprises a gate sidewall spacer and a fin sidewall spacer, the gate sidewall spacer is in contact with the first surface of the hard mark layer, the fin sidewall spacer is in contact with a fourth surface of the hard mask layer.

8. A semiconductor device, comprising:
   a first source/drain feature;

two or more first channel layers in contact with the first source/drain feature, wherein each of the two or more first channel layers includes:
  a first surface;
  a second surface opposing the first surface; and
  an end surface connecting the first surface and second surface, wherein the first surface and second surfaces are exposed to air gaps at portions adjacent the end surface;
a hard mask layer formed over the two or more first channel layers;
a gate dielectric layer formed on the two or more first channel layers and the hard mask layer, wherein one of the air gaps is formed between the hard mask layer and a topmost of the two or more first channels near the end surface;
a gate electrode layer formed on the gate dielectric layer;
a fin sidewall spacer in contact with the hard mask layer and the two or more first channel layers, wherein the fin sidewall spacer is exposed to the air gaps; and
a boundary structure in contact with the hard mask layer and the two or more first channel layers, wherein the air gaps are formed between the boundary structure and the fin sidewall spacer, and between the gate dielectric layer and the first source/drain feature.

9. The semiconductor device of claim 8, further comprising:
  a metal gate liner formed on the hard mask layer; and
  a self-alignment contact (SAC) layer formed on the metal gate liner.

10. The semiconductor device of claim 9, further comprising:
  a second source/drain feature; and
  two or more second channel layers in contact with the second source/drain feature, wherein the gate electrode is formed around the two or more second channels.

11. The semiconductor device of claim 10, further comprises a second hard mask layer formed over the two or more second channel layers, wherein the metal gate liner is formed on the second hard mask layer.

12. The semiconductor device of claim 9, wherein the metal gate liner is in contact with a top surface of the gate electrode layer, and the top surface of the gate electrode layer is coplanar with a top surface of the nanosheet of the hard mask.

13. A method for forming a semiconductor device, comprising:
  forming fin structures including two or more channel layers and a hard mask layer over the two or more channel layers with spacing layers formed between adjacent channel layers and the hard mask layer;
  forming a sacrificial gate structure over the fin structures and sidewall spacers on the sacrificial gate structure;
  recess etching the fin structures;
  removing a portion of the spacing layers to form inner spacers between the of channel layers and the hard mask layer;
  forming source/drain features;
  removing the sacrificial gate structure;
  forming a replacement gate structure comprising:
    depositing a gate dielectric layer on the two or more channel layers and the hard mask layer; and
    depositing a gate electrode layer over the gate dielectric layer;
  forming a trench along a direction perpendicular to the replacement gate structure to remove a portion of the fin structures; and
  etching the inner spacers to form air gaps.

14. The method of claim 13, further comprising:
  etching back the gate electrode layer using the hard mask layer as an etch stop; and
  depositing a self-aligned contact (SAC) layer between the sidewall spacers.

15. The method of claim 14, further comprising depositing a liner on the hard mask layer and the sidewall spacers, and the SAC layer is deposited the deposited on the liner.

16. The method of claim 13, wherein each of the nanosheet of channel layers comprises an epitaxial semiconductor layer.

17. The method of claim 16, wherein the nanosheet spacing layer comprises SiGe.

18. The method of claim 13, wherein the hard mask layer comprises silicon oxide, silicon nitride, silicon oxynitride, or a combination thereof.

19. The semiconductor device of claim 11, further comprising a hybrid fin disposed between the two or more first channels and the two or more second channels, and the gate electrode layer is disposed between the hybrid fin and the metal gate liner.

20. The semiconductor device of claim 19, further comprising a gate contact disposed through the SAC layer and the metal gate liner, and in contact with the gate electrode layer.

* * * * *